US006494132B1

(12) United States Patent
Sano et al.

(10) Patent No.: US 6,494,132 B1
(45) Date of Patent: Dec. 17, 2002

(54) SCREEN PRINTER AND A SCREEN PRINTING METHOD

(75) Inventors: Yasushi Sano, Chiba (JP); Osamu Tanaka, Niigata (JP)

(73) Assignee: Micro-Tec Company, Ltd., Chiba (JP)

( * ) Notice: Subject to any disclaimer, the term of this patent is extended or adjusted under 35 U.S.C. 154(b) by 0 days.

(21) Appl. No.: 09/473,057

(22) Filed: Dec. 28, 1999

(30) Foreign Application Priority Data

Jan. 11, 1999 (JP) ............................................. 11-004741
Mar. 15, 1999 (JP) ............................................. 11-069176

(51) Int. Cl.⁷ ................................................ B41F 15/46
(52) U.S. Cl. ........................................................ 101/123
(58) Field of Search ................................. 101/123, 124, 101/129; 118/413

(56) References Cited

U.S. PATENT DOCUMENTS

| 2,704,510 A | * | 3/1955 | Walsh, Jr. ................... 101/123 |
| 2,730,043 A | * | 1/1956 | Louft .......................... 101/123 |
| 3,017,824 A | * | 1/1962 | Ichinose ..................... 101/123 |
| 3,445,310 A | * | 5/1969 | Danielson et al. .......... 101/129 |
| 4,388,863 A | * | 6/1983 | De Santis .................... 101/129 |
| 4,524,688 A | * | 6/1985 | Glantsching ................ 101/123 |
| 4,586,433 A | * | 5/1986 | Jaffa et al. .................. 101/123 |
| 4,622,239 A | * | 11/1986 | Schoenthaler et al. ........ 427/96 |
| 4,715,278 A | * | 12/1987 | Ericsson ..................... 101/123 |
| 4,720,402 A | * | 1/1988 | Wojcik ....................... 427/282 |
| 4,854,229 A | * | 8/1989 | Vassiliou .................... 101/123 |
| 4,854,230 A | * | 8/1989 | Niki et al. ................... 101/123 |
| 4,893,556 A | * | 1/1990 | Takahashi et al. .......... 101/123 |
| 4,937,097 A | * | 6/1990 | Ichinose et al. ............. 101/123 |
| 5,388,508 A | * | 2/1995 | Dubuit ........................ 101/123 |
| 5,479,854 A | * | 1/1996 | Chikahisa et al. .......... 101/123 |
| 5,590,596 A | * | 1/1997 | Tani et al. .................. 101/123 |
| 5,802,970 A | * | 9/1998 | Tani ........................... 101/123 |
| 6,066,206 A | * | 5/2000 | Doyle et al. ................ 101/123 |
| 6,135,024 A | * | 10/2000 | Higashida et al. .......... 101/123 |
| 6,158,338 A | * | 12/2000 | MacRaild et al. .......... 101/123 |

FOREIGN PATENT DOCUMENTS

| JP | 90981 | * | 5/1983 | .................. 101/123 |
| JP | 185651 | * | 10/1984 | .................. 101/123 |
| JP | 132643 | * | 6/1987 | .................. 101/123 |
| JP | 11-179878 | * | 6/1999 | |

* cited by examiner

*Primary Examiner*—Stephen R. Funk
(74) *Attorney, Agent, or Firm*—Birch, Stewart, Kolasch & Birch, LLP

(57) ABSTRACT

Screen printing is performed by using a pressure squeegee, a main squeegee, and a scraper squeegee. Since a screen is pressed by the pressure squeegee in advance, an angle between the main squeegee and the screen is kept constant. After printing is finished by the main squeegee, the scraper squeegee scrapes a remaining ink.

3 Claims, 38 Drawing Sheets

Fig.7
(a)
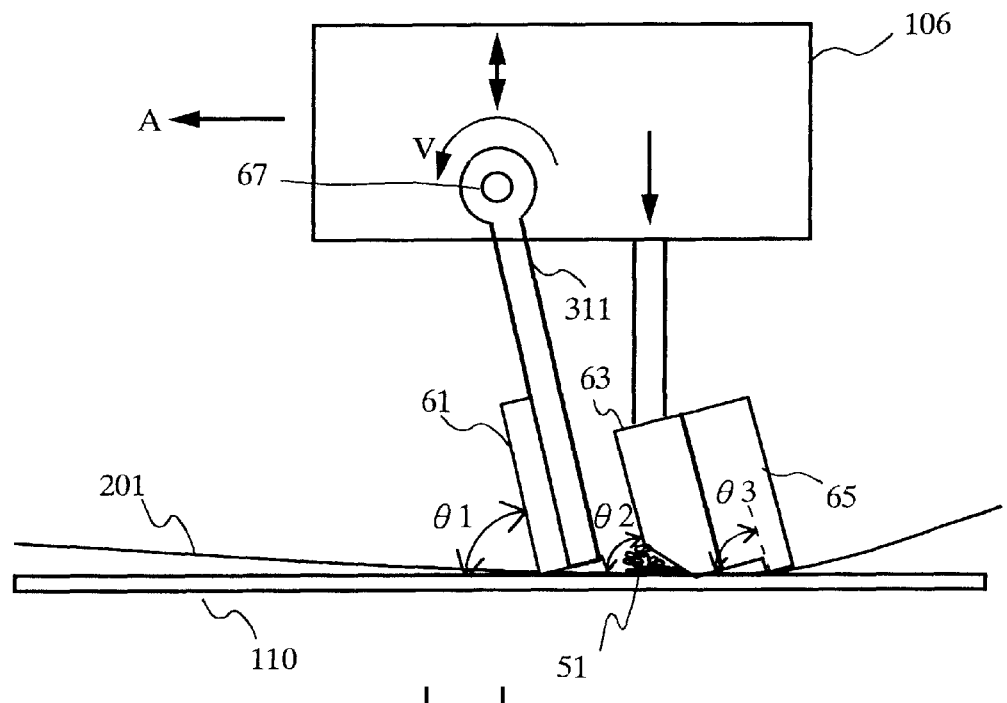
(b)
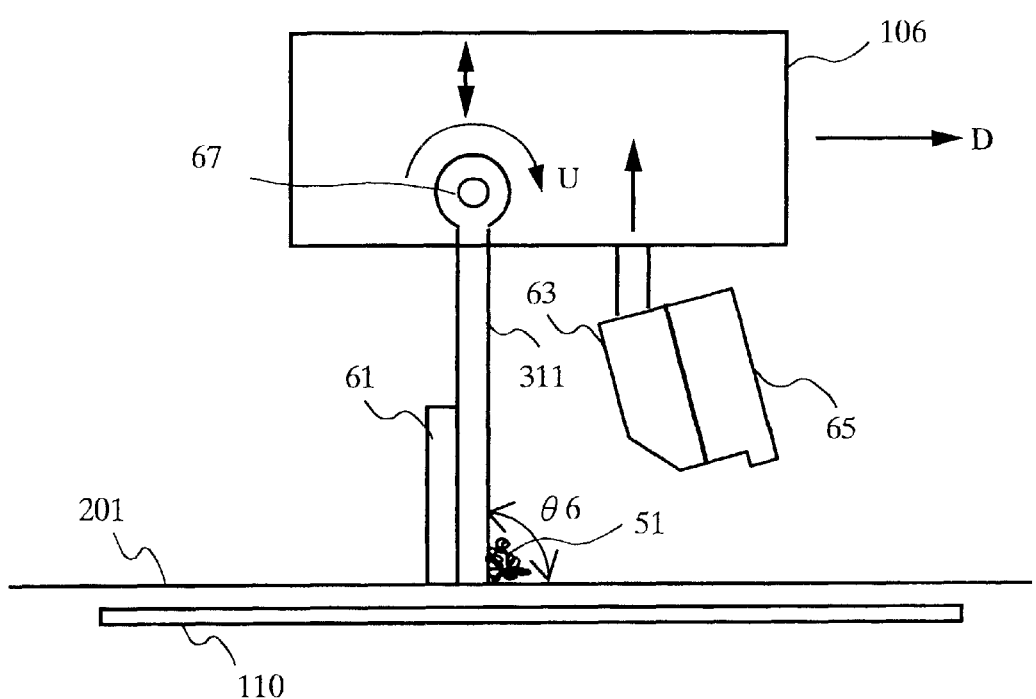

Fig.8
(a)
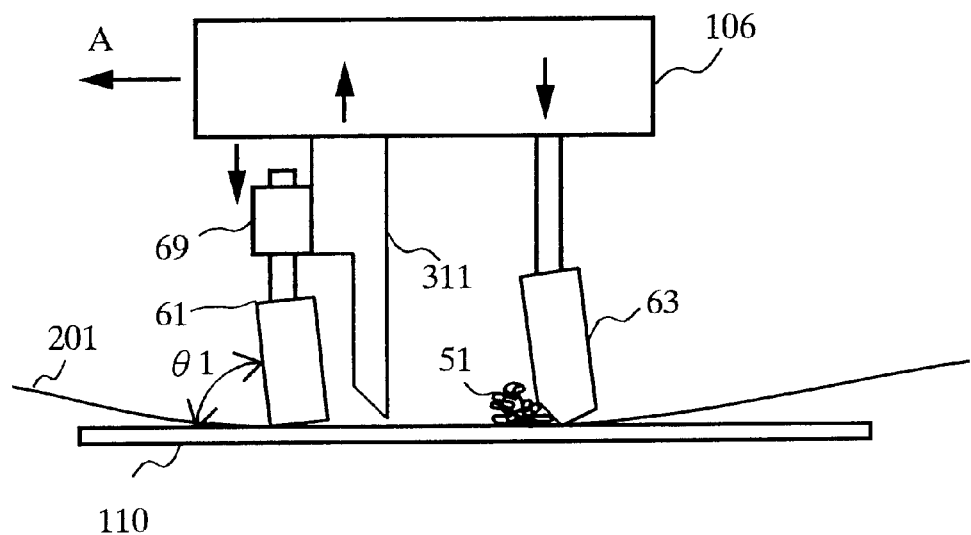
(b)
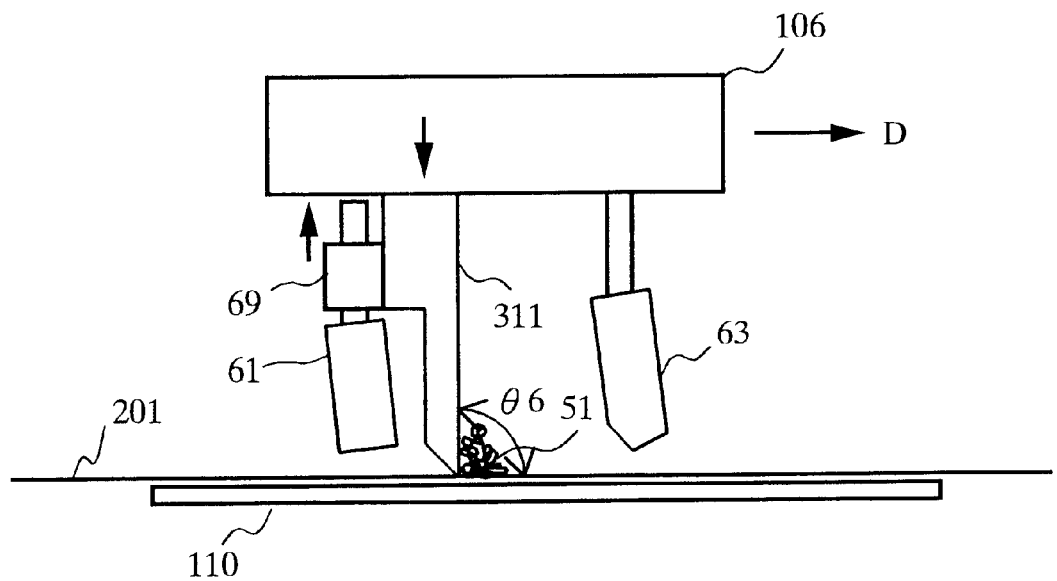

Fig.40
(a)
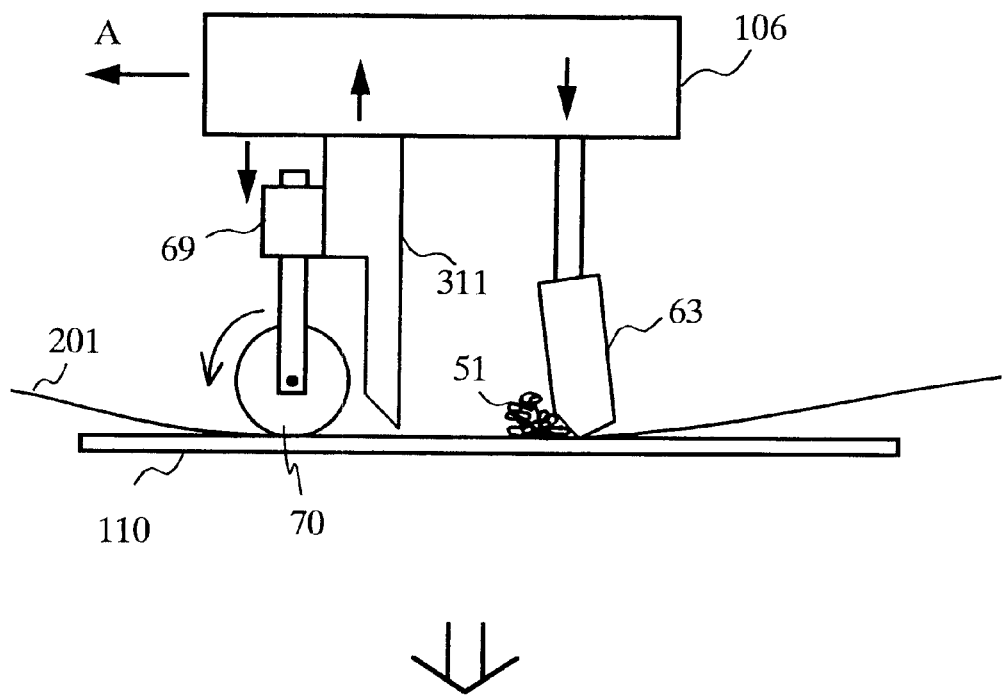
(b)
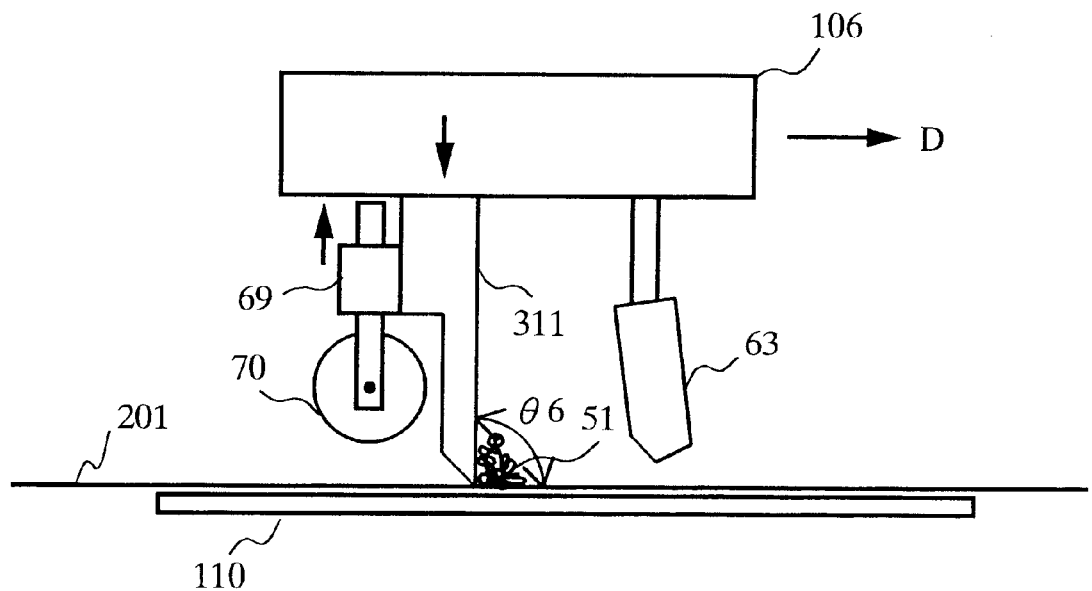

SCREEN PRINTER AND A SCREEN PRINTING METHOD

BACKGROUND OF THE INVENTION

1. Field of the Invention

This invention relates to a screen printer and its screen printing method. Particularly, this invention relates to the screen printer using a plurality of squeegees. This invention also relates to the screen printer using a pressure unit for pressing a screen.

2. Description of the Related Art

FIG. 12 illustrates a perspective view of the screen printer. FIG. 13 illustrates a schematic side view of the screen printer. FIG. 14 illustrates a schematic top view of the screen printer.

In FIG. 12, a screen printer 101, a base of the screen printer 102, a table 103 which is attached for allowing movement, a guide rail 104 for guiding the movement of the table, an operation box 105 of the screen printer, an operation switch 107 attached to the operation box, and a printing unit 109 for performing screen printing on a work placed on the table 103 are illustrated. In FIGS. 13 and 14, a work 110 placed on the table 103, a screen plate 200, a screen frame 1 of the screen plate 200, and a screen 201 affixed to the screen plate 200 are illustrated. A slider 106 for holding a squeegee 111 and a scraper (not illustrated) slides in directions of arrow A and arrow D, and a slide base 108 slides the slider 106.

The table 103 is attached for allowing left and right sliding along the guide rail 104 provided on the base 102. When the table 103 moves under the printing unit 109, the table 103 is stopped by a stopper (not illustrated), and the printing unit 109 performs screen printing on the work 110.

FIG. 15 illustrate an example of the screen plate 200.

The screen plate 200 for a combination screen is illustrated in FIG. 15.

In FIG. 15, the screen frame 1, a support screen 2, a print screen 3, and a joint part 4 of the support screen and the print screen are illustrated. The screen 201 includes the support screen 2, the print screen 3, and the joint part 4.

FIG. 16 illustrates a front surface of the print screen 3.

FIG. 17 illustrates a back surface of the print screen 3.

In FIGS. 16 and 17, a screen-mesh 30, and an emulsion 31 provided on a back of the screen-mesh 30 are illustrated. An opening 32 is provided in the emulsion 31. The opening 32 is provided for generating a print image. When an ink (paste) passes through the opening and sticks to the work 110, screen printing is performed on the work.

FIGS. 18 and 19 show cross-sectional views at X—X part of the screen printer illustrated in FIG. 14. A squeegee holder 120 and a scraper holder 320 are attached to the slider 106 for allowing up and down movement by a mechanism which is not illustrated. In FIG. 18, the slider 106 is moving in the direction of arrow A, and the squeegee 111, secured for example, against squeegee bracket 111a, is pushed down in the direction of arrow B. Printing is performed on the work 110 by using an ink 51. The scraper holder 320 holds a scraper 311, and the scraper holder is moved up in a direction of arrow C during a printing operation by the squeegee. When printing is performed by using the squeegee 111, printing is performed with a high pressure. As illustrated in FIG. 18, the screen is pressed by a pressure applied to the squeegee at a point R in which the squeegee and the screen contact each other. When the squeegee moves, the point R moves on the surface of the screen.

In case of FIG. 19, the slider moves in a direction of arrow D. When the slider moves in the direction of arrow D, the squeegee holder 120 is pulled up in a direction of arrow E. At the same time, the scraper holder 320 is pushed down in a direction of arrow F, and the scraper 311 moves on the surface of the screen in contact with the screen 201. The scraper 311 has a function for pushing the ink 51, which has been moved to a right side of FIG. 19 by the squeegee 111, back to a left side of FIG. 19. The scraper 311 also has a function for re-coating the surface of the screen evenly with the ink after printing is performed by the squeegee 111.

The screen printer performs screen printing by moving the squeegee 111 in the direction of arrow A as illustrated in FIG. 18. As illustrated in FIG. 19, when the slider is moved in the direction of arrow D, the ink is returned, and the surface of the screen is evenly re-coated with the ink.

FIG. 20 illustrates a sectional view of the screen in case that the squeegee 111 in FIG. 18 has performed printing on the work 110. The ink 51 passes through the opening 32 of the emulsion provided on the back side of the screen-mesh, and sticks to the work 110. Since the squeegee 111 is made of an elastic material, e.g., urethane rubber, etc., when the squeegee 111 has passed, the ink 51 on the surface of the screen is evenly scraped.

In FIG. 21, the scraper 311 returns the ink. The scraper 311 is made of a metal, e.g., stainless, etc. The scraper includes a taper part 312 at an end, and contacts with the surface of the screen at point Q. Since the scraper 311 is made of the metal, e.g., stainless, etc., when the scraper 311 has passed, the surface of the screen is evenly coated with the ink 51. In this way, an evenly coated condition is generated. Therefore, next printing can be performed evenly by the squeegee 111.

FIG. 22 illustrates the printing unit 109 in a printing state. The screen 201 is evenly coated with the ink 51.

(a) of FIG. 22 illustrates a state before starting printing. In (b) of FIG. 22, a pressure P is applied to the squeegee 111, and printing is started. In (c) of FIG. 22, patterns 52, 53 and 54 have been printed on the work 110 from patterns which are generated on the screen 201 in advance. In (d) of FIG. 22 illustrates a time of completing printing is illustrated further including patterns 55 and 56. During printing in (b)–(d) of FIG. 22, the pressure P applied to the squeegee 111 is constant as shown in (e) of FIG. 22.

When printing is performed as illustrated in FIG. 22, a height H1 of the pattern 52 and a height H2 of the pattern 54 illustrated in (d) of FIG. 22 may differ. Even though the screen 201 is tightly stretched over the screen frame 1, angles vary in positions on the screen 201. Therefore, even if the constant pressure P is applied downward during printing, there is a possibility that a printed pattern may be spread forward in some printing position. Hence, such problems like uneven thickness of the ink on the work 110 and uneven printing have to be solved.

As shown in FIG. 22, angles α, β, and γ between the screen 201 and the work 110 change during printing (α<β<γ). Since the angles between the screen 201 and the work 110 vary in printing positions, there are solving problems such as uneven thickness of the ink on the work 110 and uneven printing.

FIG. 23 illustrates a method for solving the above-stated uneven thickness of the ink.

In FIG. 23, during printing, the screen plate 200 is lifted up in a direction of arrow X by using a detaching apparatus (plate detaching apparatus) which is not illustrated. By detaching the screen plate 200 from a side in which printing is finished, changes in a tension in the positions on the screen 201 are intended to be ignored. Consequently, the height H1 of the pattern 52 and, for example, pattern 56 printed at an edge area of the work 110 and the height H2 of the pattern 54 printed at a center of the work 110 can become almost equal with the height patters 53 and 55 also being almost equal to edge patterns 52 and 56 and center pattern 54.

However, according to the method of lifting one side of the screen plate 200 as illustrated in FIG. 23, an excessive pressure is applied to the screen plate 200. As a result, printing patterns provided on the screen 201 might be shifted, and a durability of the screen plate 200 might be reduced.

FIG. 24 illustrates a screen printer with two squeegees according to the related art.

In (a) of FIG. 24, printing is performed by using the squeegee 111. In (b) of FIG. 24, printing is performed by using a squeegee 112.

The screen printer in FIG. 24 can print in both directions of arrows A and D. After printing is performed in (a) of FIG. 24, the work 110 is taken out, and another work 110 is put in. Then, printing is performed in (b) of FIG. 24. By repeating operations in (a) and (b) of FIGS. 24, printing can be performed in a higher speed.

FIG. 25 also illustrates screen printing by using two squeegees.

Squeegees 113 and 114 are arranged in a straight line. The screen printer as illustrated in FIG. 25 is used in case that an area between the squeegees 113 and 114 should not be printed or can not be printed due to roughness on the work.

FIGS. 24 and 25 illustrate the screen printer using two squeegees. However, as stated, no consideration is made for printing evenly on the work.

SUMMARY OF THE INVENTION

It is an object of a preferred embodiment of this invention to provide a screen printer for printing evenly on a work. Particularly, it is an object of a preferred embodiment of this invention to provide a screen printer for printing in higher quality by using a plurality of squeegees.

According to one aspect of this invention, a screen printer for performing screen printing on a work by using a squeegee includes a main squeegee for performing screen printing and a supplementary squeegee for supplementing screen printing by the main squeegee during screen printing by the main squeegee.

According to another aspect of this invention, a screen printer includes two squeegees, and the two squeegees are used together successively to print a determined area on a screen for one stroke.

According to another aspect of this invention, a screen printing method for a screen printer which has a main squeegee and a supplementary squeegee includes a step of performing screen printing by moving of the main squeegee in a printing direction with pressing a screen and a step of moving of the supplementary squeegee in the printing direction with pressing the screen by keeping a determined distance from the main squeegee in the printing direction during screen printing by the main squeegee.

According to another aspect of this invention, a screen printer for performing screen printing on a work by using a squeegee includes a main squeegee for performing screen printing and a pressure unit provided ahead in a printing direction during screen printing by the main squeegee for pressing a screen against the work.

According to another aspect of this invention, a screen printing method for a screen printer which has a main squeegee and a pressure unit includes a step of performing screen printing by moving the main squeegee in a printing direction with pressing a screen and a step of moving the pressure unit in the printing direction with pressing the screen by keeping a determined distance in the printing direction from the main squeegee during screen printing by the main squeegee.

According to another aspect of this invention, a screen printer for performing screen printing includes a first squeegee and a second squeegee for moving forward and backward. The first squeegee is a pressure squeegee for pressing the screen and the second squeegee is a main squeegee for performing screen printing in the forward movement, and the second squeegee is the pressure squeegee for pressing the screen and the first squeegee is the main squeegee for performing screen printing in the backward movement.

Further features and applications of the present invention will become apparent from the detailed description given hereinafter. However, it should be understood that the detailed description and specific examples, while indicating preferred embodiments of the invention, are given by way of illustration only, since various changes and modifications within the spirit and scope of the invention will become apparent to those skilled in the art from this detailed description.

Other objects features, and advantages of the invention will be apparent from the following description when taken in conjunction with the accompany drawings.

BRIEF DESCRIPTION OF THE DRAWINGS

FIG. 7 illustrates a squeegee unified with the screen printer according to this invention;

FIG. 8 illustrates a squeegee which can move vertically against a scraper in the screen printer according to this invention;

FIG. 40 illustrates the pressure roller 70 which can move vertically against the scraper in the screen printer according to this invention;

DETAILED DESCRIPTION OF THE PREFERRED EMBODIMENTS

Embodiment 1.

FIGS. 1–5 illustrate printing operations by the screen printer according to this invention.

Figure 6:
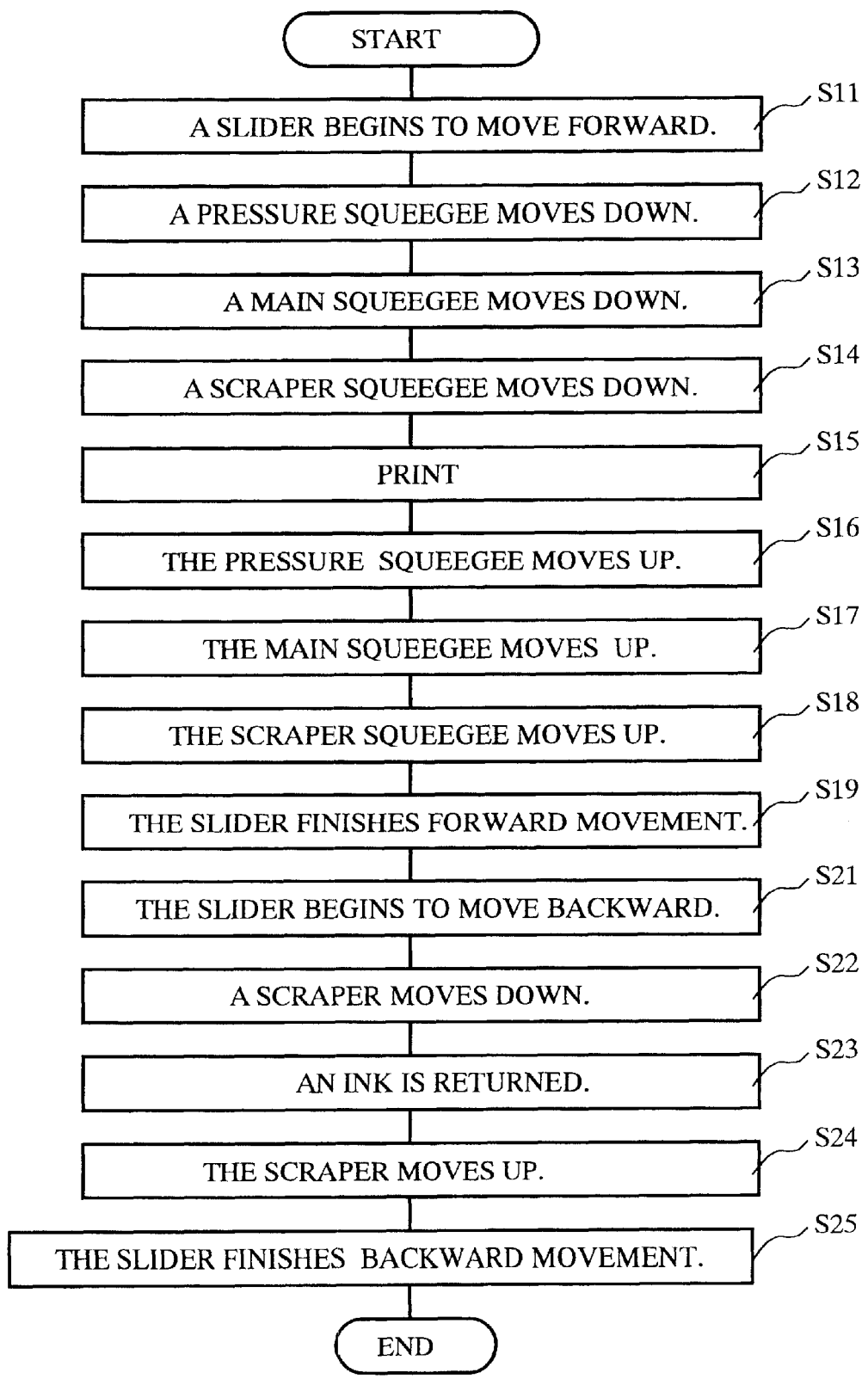
FIG. 6 shows a flow chart of operations of the screen printer according to this invention.

FIG. 6 shows a flow chart of the printing operation.

Figure 1:
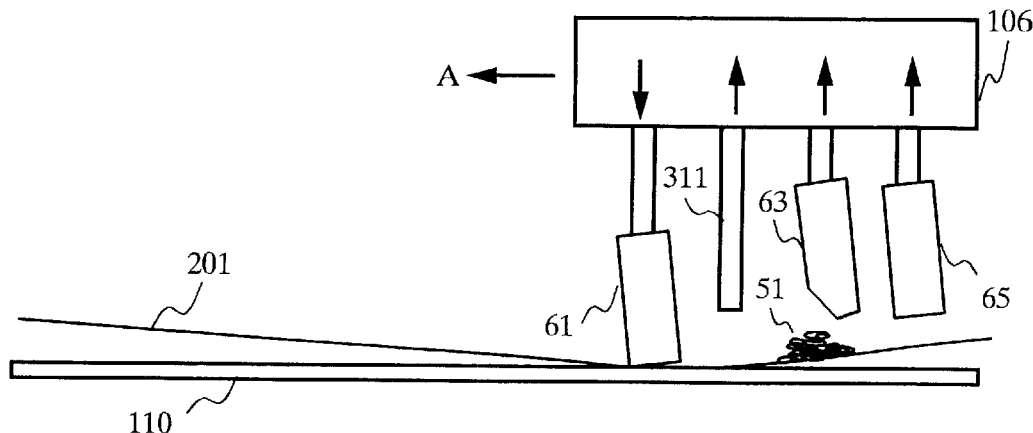
FIG. 1 illustrates a printing state of a screen printer according to this invention.

In FIG. 1, the slider 106 starts forward movement (in a direction of arrow A). The direction of arrow A is a direction of printing (step S11). Then, a pressure squeegee 61 moves down from the slider 106 (step S12).

Figure 2:
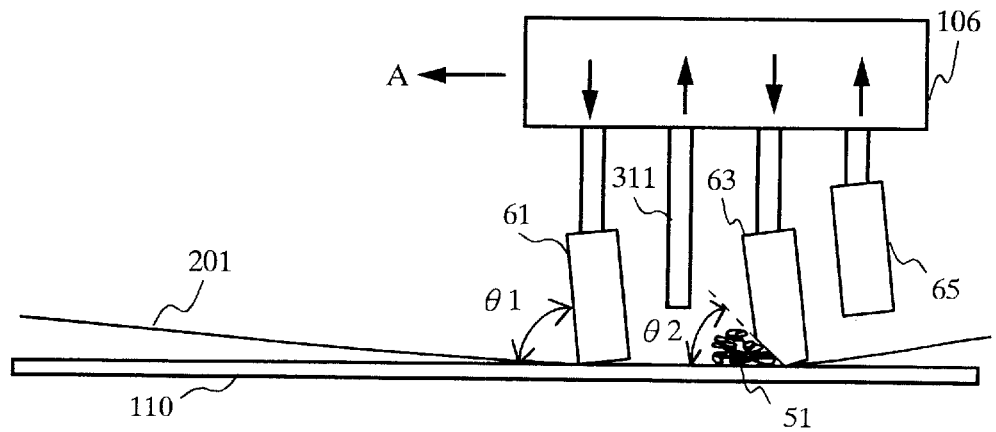
FIG. 2 illustrates a printing state of the screen printer according to this invention.

In FIG. 2, a main squeegee 63 moves down (step S13).

Figure 3:
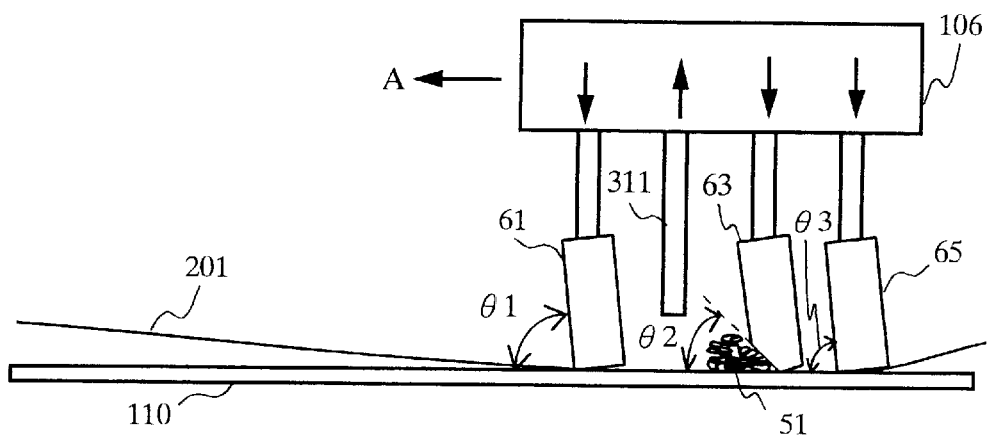
FIG. 3 illustrates a printing state of the screen printer according to this invention.

In FIG. 3, a scraper squeegee 65 moves down (step S14). In a state illustrated in FIG. 3, printing is continued in the direction of arrow A (step S15).

Figure 4:
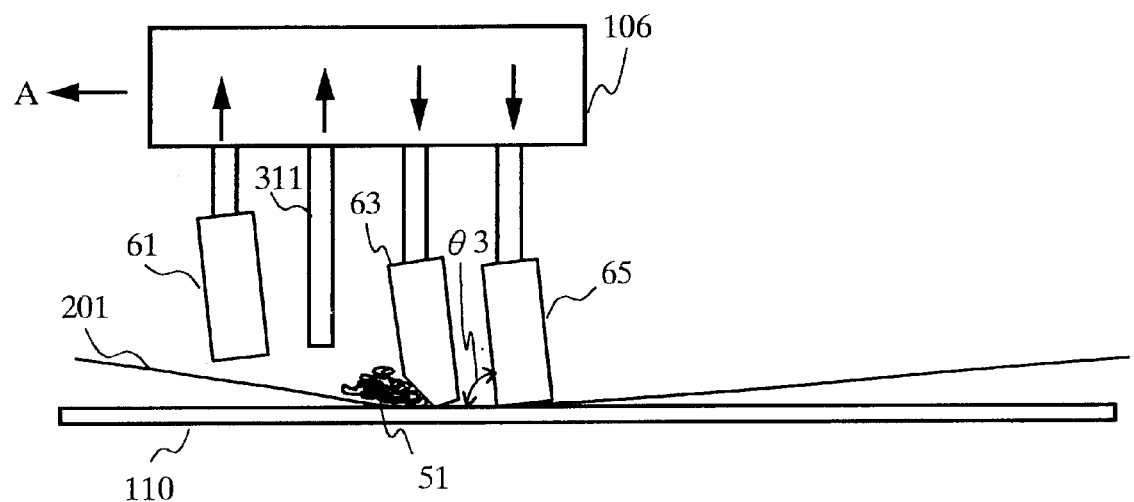
FIG. 4 illustrates a printing state of the screen printer according to this invention.

In FIG. 4, the pressure squeegee 61 moves up (step S16). Then, the main squeegee 63 moves up (step S17), and the scraper squeegee 65 moves up (step S18). In this way, printing is finished, and the slider 106 finishes its forward movement (step S19). Steps S11–S19 are called as one stroke.

Figure 5:
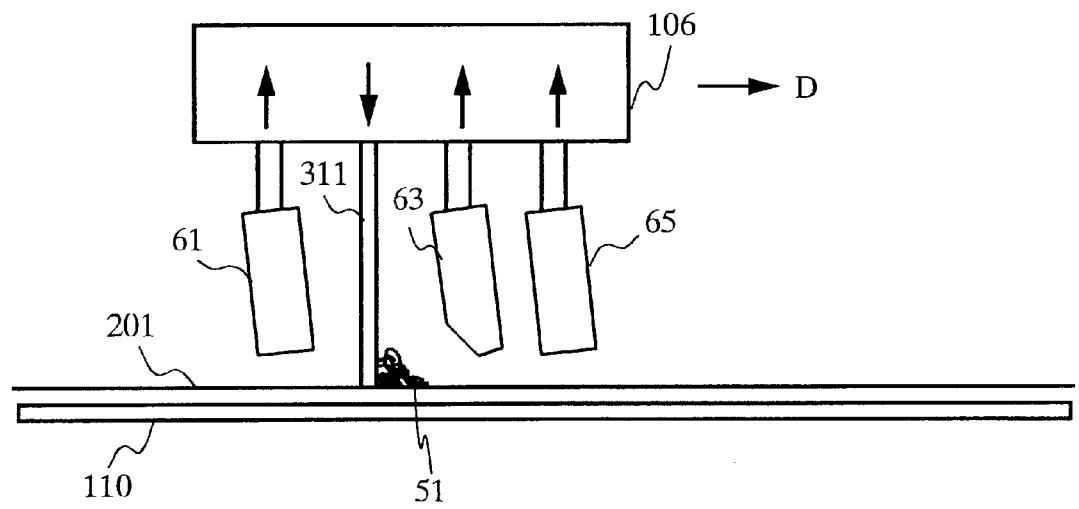
FIG. 5 illustrates a printing state of the screen printer according to this invention.

Then, the slider 106 starts backward movement (in a direction of arrow D) (step S21). The scraper 311 moves down (step S22). Since the slider 106 moves in the direction of arrow D while the scraper 311 is down, the screen 201 is evenly coated with the ink 51 as illustrated in FIG. 5 (step S23). Finally, the scraper 311 moves up (step S24), and the slider 106 finishes its backward movement (step S25). These are printing operations on the work 110.

By repeating above-stated operations for each of works continuously, printing can be performed on the works continuously.

A characteristic feature of embodiment 1 is that the pressure squeegee 61 is provided as a supplementary squeegee for the main squeegee 63. Further, the scraper squeegee 65 is provided as a supplementary squeegee for the main squeegee 63.

A squeegee of the screen printer must have the following three functions:
(1) a pressure function for making the screen 201 in contact with the work 110;
(2) a deposition function for depositing the ink 51 to the work 110 through the screen 201; and
(3) a scraper function for scraping the excessive ink 51 on the screen 201.

According to the related art, the pressure function, deposition function, and scraper function are achieved by a squeegee. However, according to embodiment 1, the three functions are shared by the pressure squeegee 61, main squeegee 63, and scraper squeegee 65, i.e., the pressure squeegee 61 has the pressure function, the main squeegee 63 has the deposition function, and the scraper squeegee 65 has the scraper function.

Figure 26:
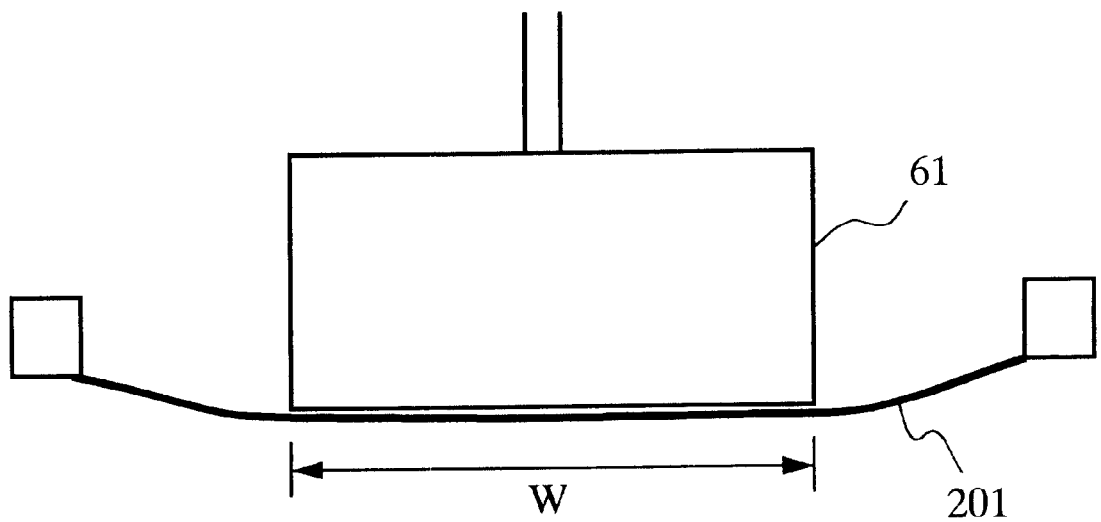
FIG. 26 illustrates a front view of a pressure squeegee 61 according to this invention.
Figure 27:
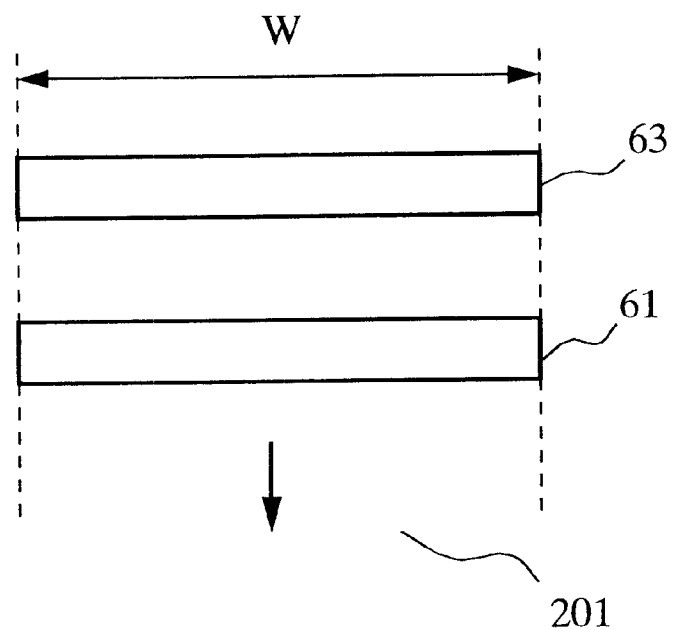
FIG. 27 illustrates a top view of the pressure squeegee 61 and a main squeegee 63.

FIG. 26 illustrates a front view of the pressure squeegee 61. FIG. 27 illustrates a top view of the pressure squeegee 61 and main squeegee 63.

As illustrated in FIGS. 26 and 27, the pressure squeegee 61 and main squeegee 63 have a same width W. It is also possible to make a width of the pressure squeegee 61 wider than a width of the main squeegee 63. Accordingly, the pressure squeegee 61 presses an area on the screen 201 wider than the width of the main squeegee 63. Hence, the screen 201 is able to be pushed down for the full width of the main squeegee 63.

Figure 22:
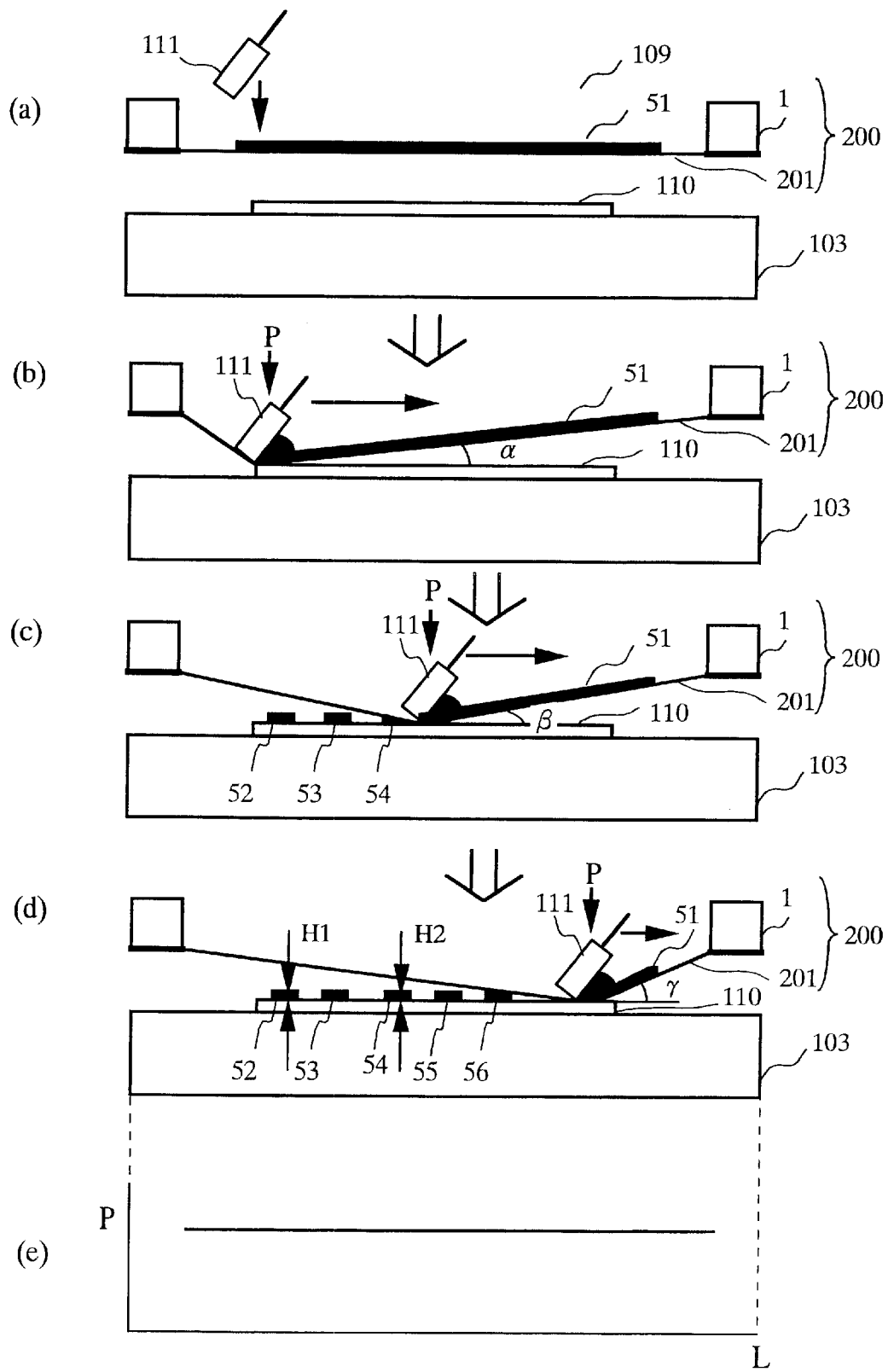
FIG. 22 illustrates problems in the screen printer according to the related art.
Figure 23:
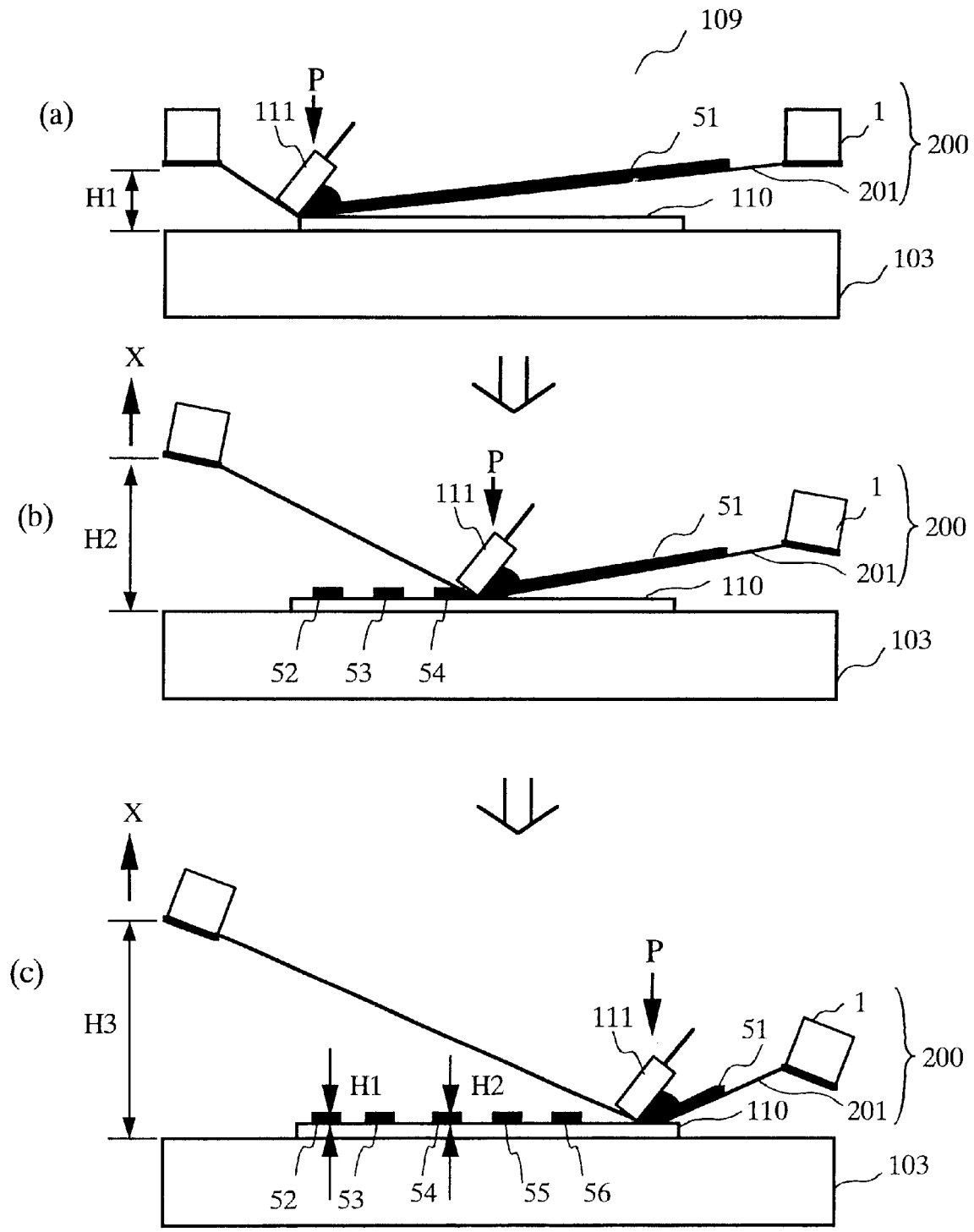
FIG. 23 illustrates problems in the screen printer according to the related art.

The pressure by the pressure squeegee 61 is enough as far as the screen 201 can be contacted with the work 110. The pressure squeegee 61 is provided ahead of the main squeegee 63 in the printing direction. Therefore, a surface of the screen 201 and a surface of the work are almost parallel between the pressure squeegee 61 and the main squeegee 63, or the surfaces are contacted each other between the pressure squeegee 61 and the main squeegee 63. Since the surface of the screen 201 and the surface of the work 110 are contacted, the problem as illustrated in FIG. 22, that angles between the screen 201 and the work 110 vary in the positions on the screen, can be solved. Further, a quality of printing can be improved. An angle θ1 between the pressure squeegee 61 and the work 110 (or screen 201) should be 80–85 degree (80–85°). The pressure squeegee 61 can be in any material, e.g., rubber and plastic, as far as the screen 201 is not damaged. Since the ink 51 is provided between the scraper 311 and the main squeegee 63, and the screen 201 is evenly coated with the ink by the scraper 311, the pressure squeegee 61 performs printing by using the evenly coated ink. This printing by the pressure squeegee 61 is not enough. However, the next coming main squeegee and the ink carried by the main squeegee can realize printing in high quality.

Figure 28:
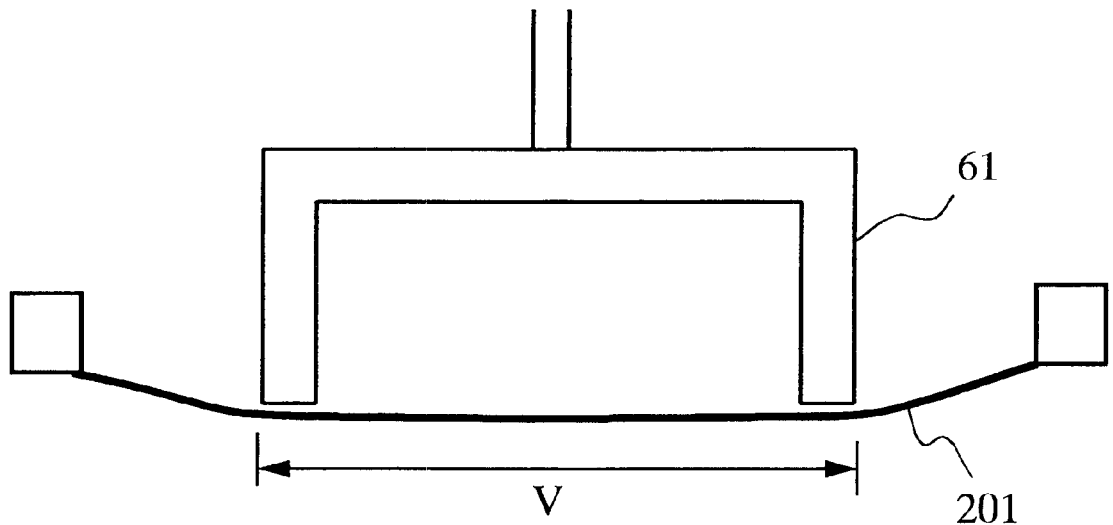
FIG. 28 illustrates a front view of the pressure squeegee 61 according to this invention.

FIG. 28 illustrates a front view of another example of the pressure squeegee 61.

Figure 29:
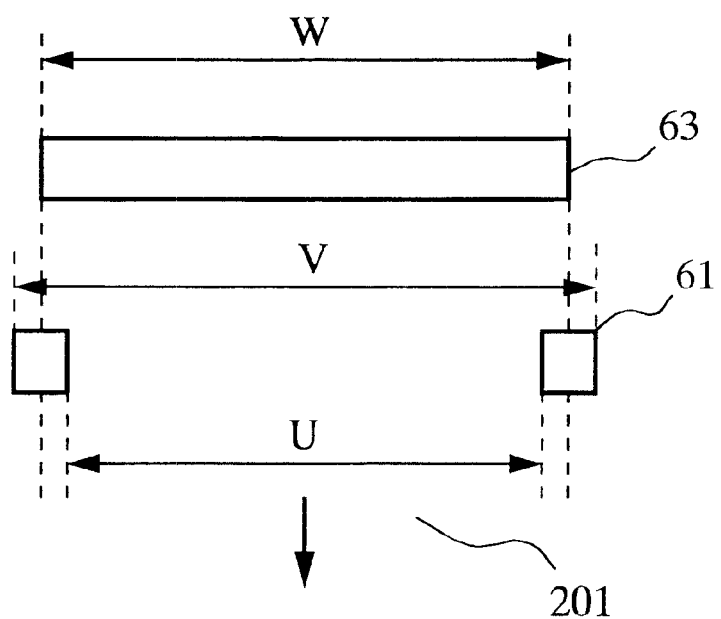
FIG. 29 illustrates a top view of the pressure squeegee 61 and the main squeegee 63 according to this invention.

FIG. 29 illustrates a top view of the pressure squeegee 61 and the main squeegee 63.

In FIGS. 28 and 29, the pressure squeegee 61 has a pair of left and right squeegee parts (a pair of squeegees). In FIGS. 28 and 29, a width V of the left and right squeegee 60 parts is slightly wider than the width W of the main squeegee 63. Since the screen 201 does not contact with the pressure squeegee 61 at all in an area of a width U between the squeegee parts of the pressure squeegee 61, printing is not performed in this area by the pressure squeegee 61, i.e., printing is performed only by the main squeegee 63. By arranging a printing field (a printing pattern of screen printing) in the area of the width U, it is possible to print only by the main squeegee 63 as in the related art.

A main function of the main squeegee 63 is to deposit the ink 51 from the screen 201. An angle θ2 between the main squeegee 63 and the work 110 (or screen 201) should be smaller for depositing the ink 51 smoothly. For example, it should be 10–70 degree. When there is a through-hole or groove on the work 110, and the through-hole or groove must be filled with the ink 51, the angel θ2 should be smaller. When the screen 201 is thick, the θ2 should be also smaller. By making the angle θ2 smaller, an efficiency in deposition of the ink 51 is improved. However, there is a tendency that an excessive ink 51 remains on the screen 201 after printing.

A function of the scraper squeegee 65 is to scrape the excessive ink 51 on the screen after printing. An angle θ3 between the work 110 (or screen 201) and the scraper squeegee 65 should be close to 90 degree for scraping the ink on the screen 201, e.g., 70–90 degree The scraper squeegee 65 can also be in any material, e.g., rubber, plastic, etc. as far as the screen 201 is not damaged.

The scraper squeegee 65 also has a function to make the surface of the screen and the surface of the work contact each other between the main squeegee 63 and the scraper squeegee 65 even after the main squeegee 63 has passed.

In embodiment 1, the pressure squeegee 61, main squeegee 63, and scraper squeegee 65 are arranged in parallel in the printing direction with determined intervals. Three squeegees which are arranged in parallel press the screen simultaneously, and screen printing is performed.

Figure 24:
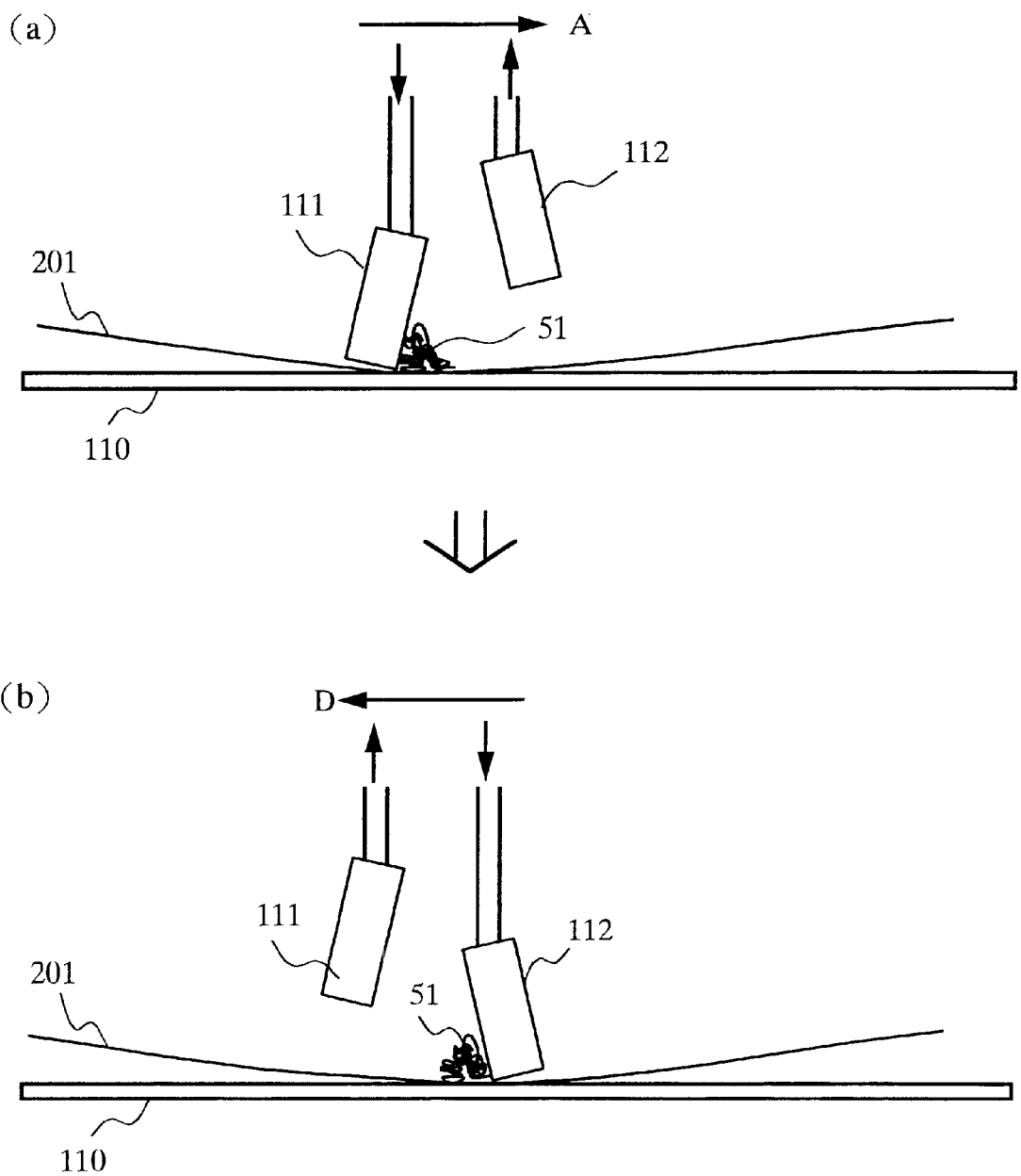
FIG. 24 illustrates a screen printer with two squeegees according to the related art.
Figure 25:
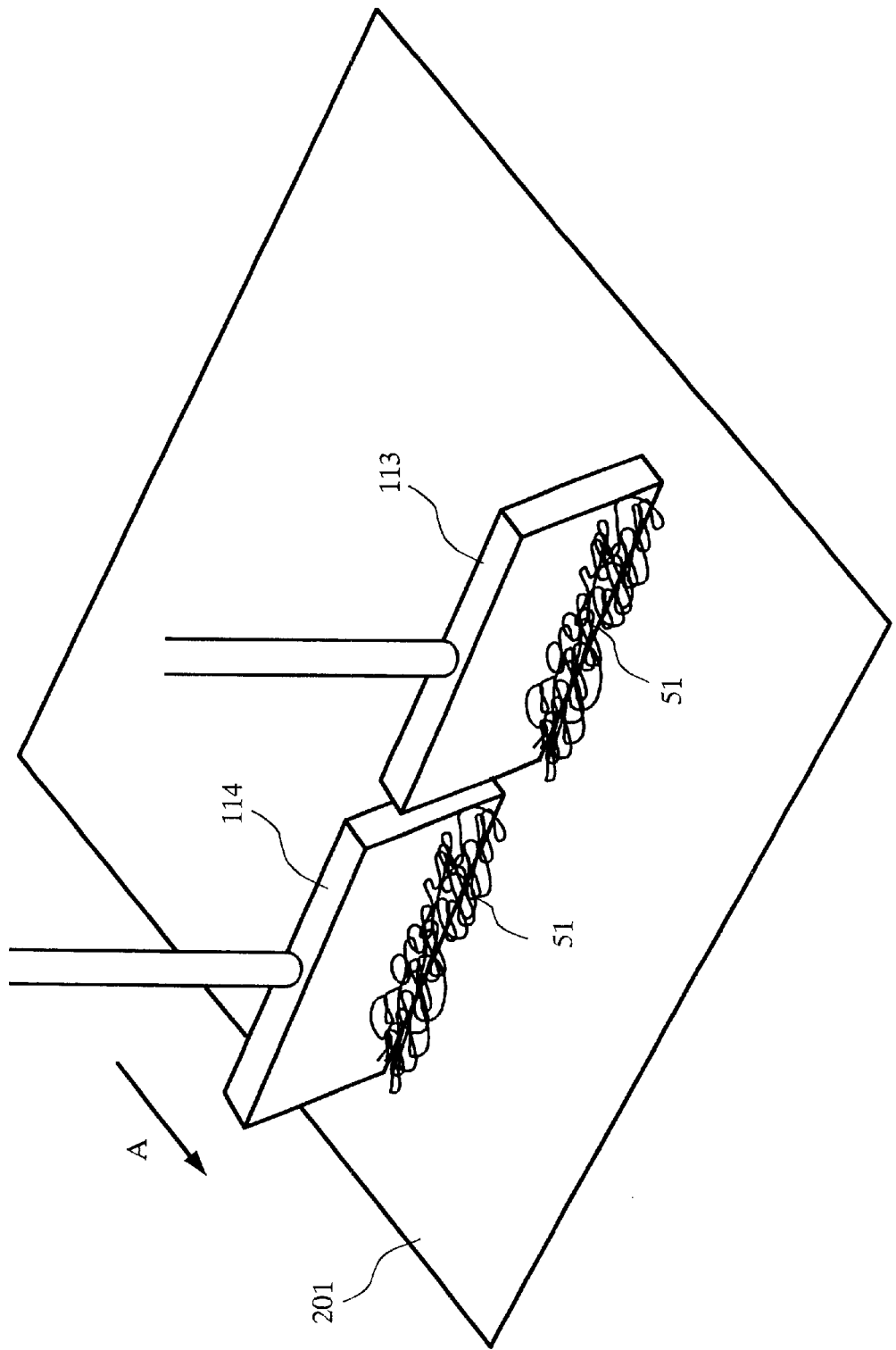
FIG. 25 illustrates the screen printer with two squeegees according to the related art.

The screen printer in embodiment 1 differs from the screen printer using the plurality of squeegees according to the related art as illustrated in FIGS. 24 and 25. In the screen printer according to embodiment 1, the plurality of squeegees moves in a same determined area (i.e., printing field) on the screen for one stroke.

In embodiment 1, the pressure squeegee 61 and the scraper squeegee 65 are provided. However, either the pressure squeegee 61 or the scraper squeegee 65 is not necessary. When the pressure squeegee 61 is not provided, the main squeegee 63 also has the pressure function of the pressure squeegee 61. When the scraper squeegee 65 is not provided, the main squeegee 63 also has the scraper function of the scraper squeegee 65.

Embodiment 2.

In embodiment 2, a pressure roller 70 (an example of a pressure unit) is used instead of the pressure squeegee 61.

Figure 30:
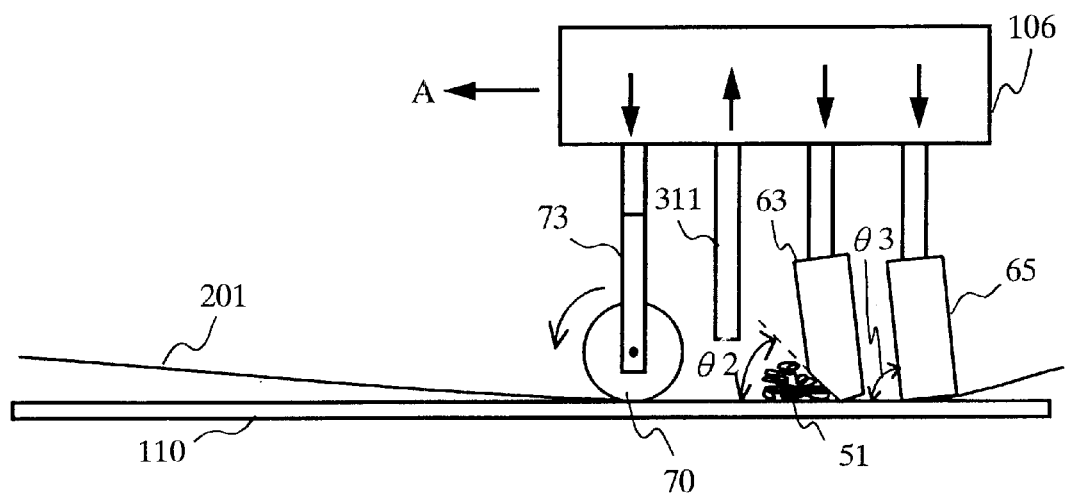
FIG. 30 illustrates a printing state of the screen printer using a pressure roller 70 according to this invention.

FIG. 30 illustrates a printing operation in case of using the pressure roller 70.

Figure 31:
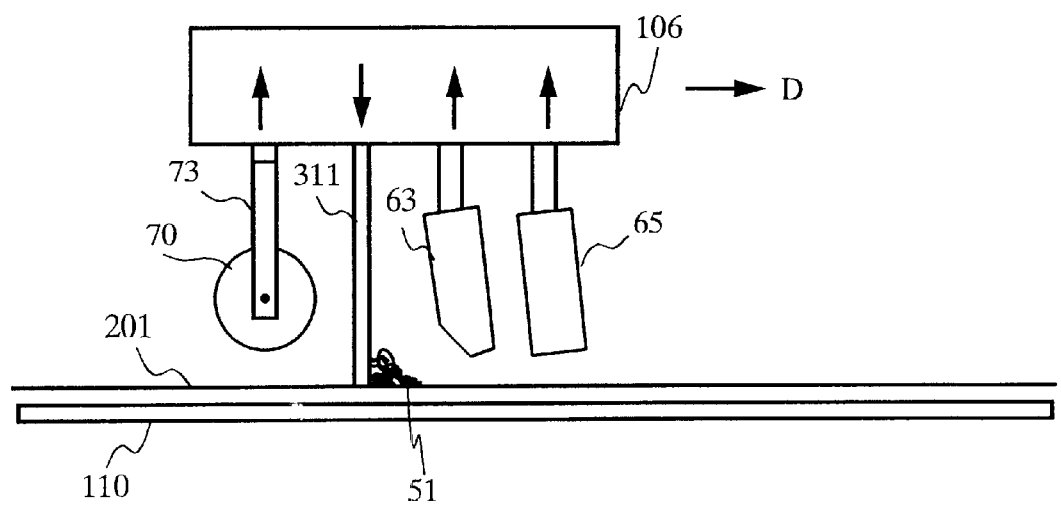
FIG. 31 illustrates a printing state of the screen printer using the pressure roller 70 according to this invention.

FIG. 31 illustrates an operation of returning the ink in case of using the pressure roller 70.

Figure 32:
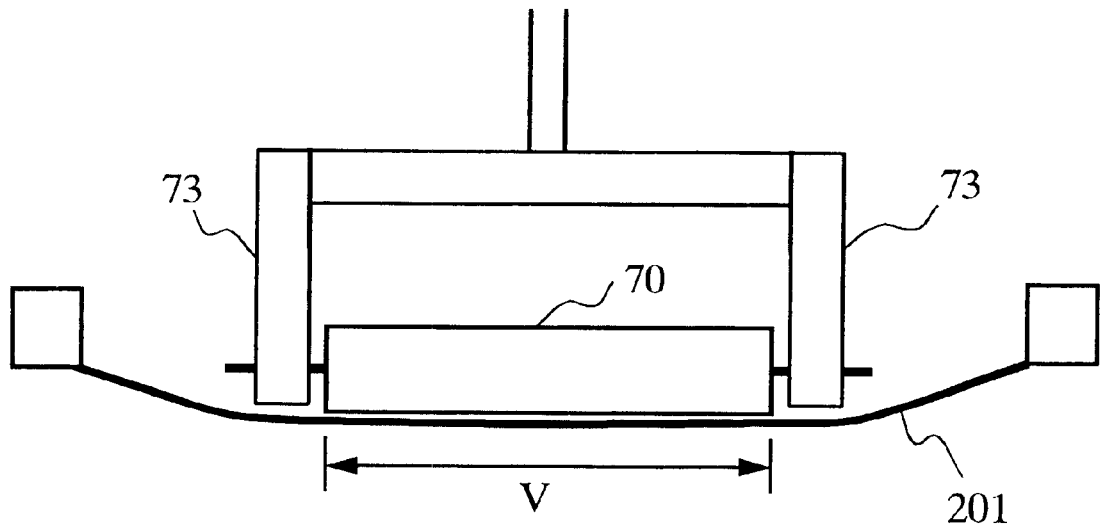
FIG. 32 illustrates a front view of the pressure roller 70 according to this invention.

FIG. 32 illustrates a front view in case of using the pressure roller 70.

Figure 33:
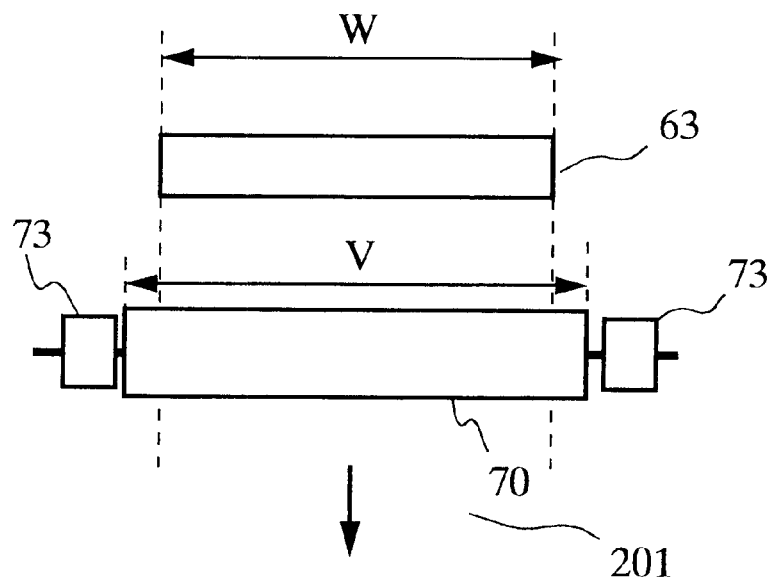
FIG. 33 illustrates a top view of the pressure roller 70 and the main squeegee 63 according to this invention.

FIG. 33 illustrates a top view in case of using the pressure roller 70.

The pressure roller 70 is attached for allowing rotation by a roller holder 73. The roller holder 73 is attached to the slider 106 for allowing up and down movement. The pressure roller 70 is made of rubber, urethane, plastic, etc. The pressure roller 70 can be any material, as far as the screen 201 is not damaged. A function of the pressure roller 70 is as the stated function of the pressure squeegee 61, and the pressure roller 70 has a function for pressing the screen 201. Since the pressure roller 70 is attached for allowing rotation, a friction against the screen 201 is seldom generated.

Figure 34:
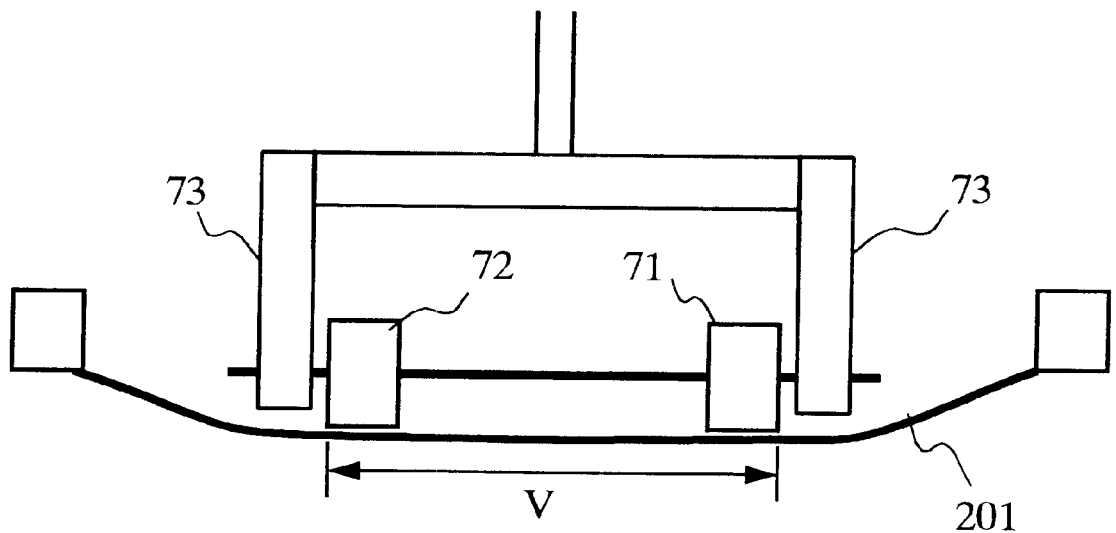
FIG. 34 illustrates a front view of a right pressure roller 71 and a left pressure roller 72 according to this invention.

FIG. 34 illustrates a front view in case of dividing the pressure roller 70 into a right pressure roller 71 and a left pressure roller 72.

Figure 35:
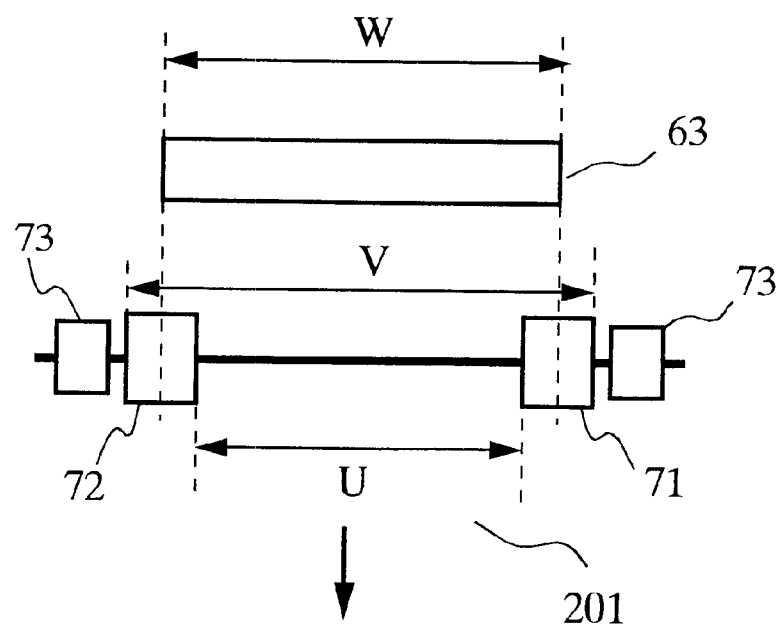
FIG. 35 illustrates a top view of the right pressure roller 71, left pressure roller 72 and main squeegee 63 according to this invention.

FIG. 35 illustrates its top view.

In FIGS. 34 and 35, an idea shown in FIGS. 28 and 29 is applied to a roller. In FIGS. 34 and 35, the width V is wider than the width W, and the width U is wider than the printing field. By making the width U wider than the printing field, the right pressure roller 71 and the left pressure roller 72 become not to take part in the printing operation at all and achieve only the pressure function.

Figure 36:
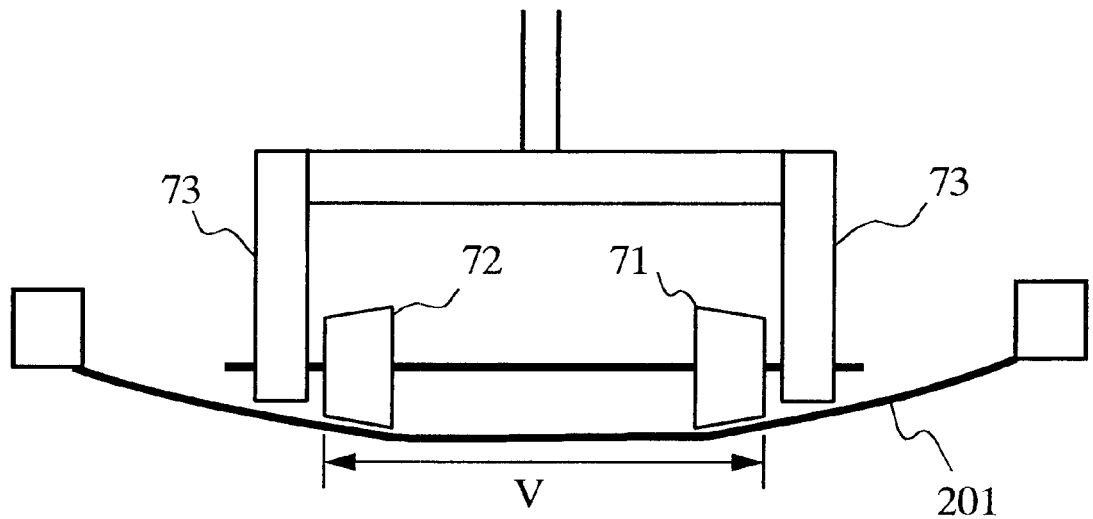
FIG. 36 illustrates a front view of the right pressure roller 71 and the left pressure roller 72 according to this invention.
Figure 37:
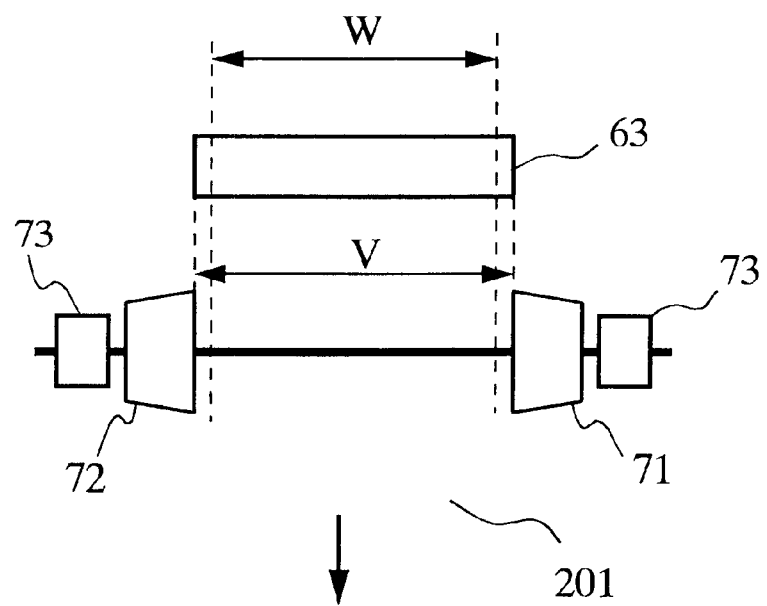
FIG. 37 illustrates a top view of the right pressure roller 71, left pressure roller 72, and main squeegee 63 according to this invention.

In FIGS. 36 and 37, the right pressure roller 71 and the left pressure roller 72 are shaped differently.

The right pressure roller 71 and the left pressure roller 72 are in a form of a sliced cone. Since the cone is sliced, a taper part is generated. Hence, a possibility of damaging the screen 201 is lessened. An angle of the taper part should be almost same as an angle of the screen bent by the pressure.

Figure 38:
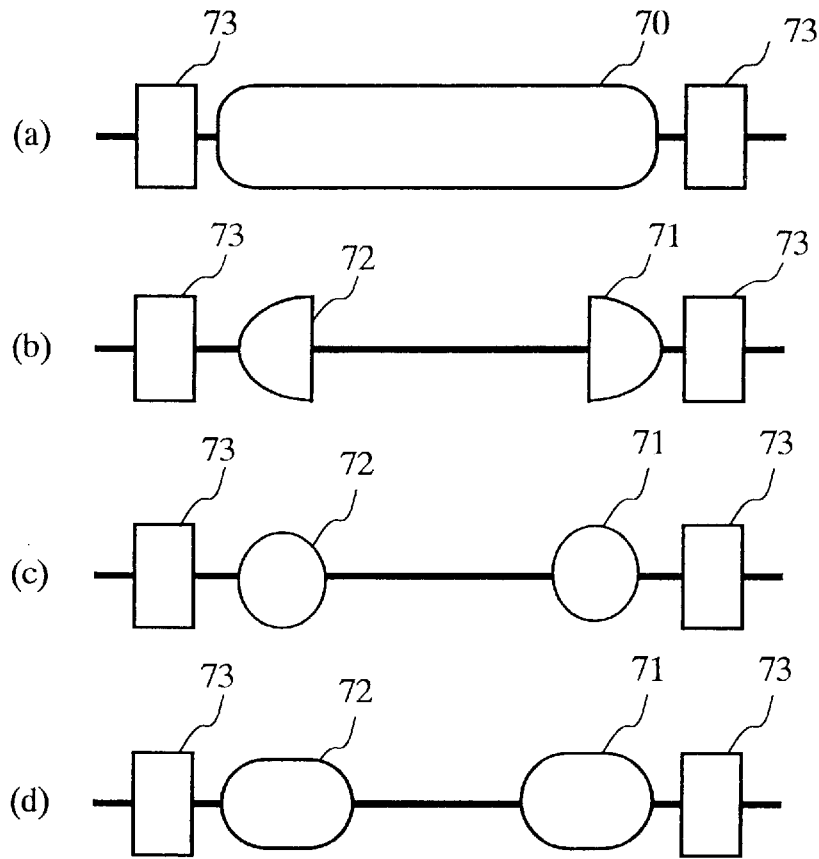
FIG. 38 illustrates another example of the pressure roller 70, right pressure roller 71, and left pressure roller 72 according to this invention.

FIG. 38 illustrates other examples of the pressure roller 70, the right pressure roller 71, and the left pressure roller 72.

In (a) of FIG. 38, both ends of the pressure roller 70 are rounded.

In (b), (c), and (d) of FIG. 38, the right pressure roller 71 and the left pressure roller 72 are rounded. In each of (a), (b), (c), and (d) of FIG. 38, the screen 201 is pressed by a rounded surface. Therefore, the screen 201 is not damaged.

Figure 39:
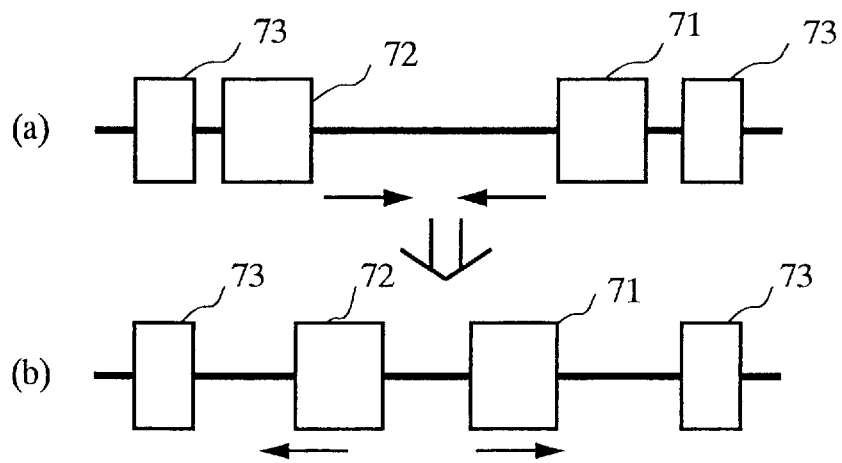
FIG. 39 illustrates the right pressure roller 71 and left pressure roller 72 which can slide according to this invention.

In FIG. 39, the right pressure roller 71 and the left pressure roller 72 can slide in directions of arrows, i.e., a direction of a rotary axis.

Since a width between the right pressure roller 71 and the left pressure roller 72 can be changed, an optimal pressure width can be selected based on a size of the printing field or a width of the squeegee. Hence, a better pressure function can be realized, and a damage on the screen 201 can be lessened by preventing an excessive pressure. For example, when even if the screen 201 is small, the width between the right pressure roller 71 and the left pressure roller 72 is wide, very strong force is given at both ends of the screen 201. Therefore, a slack of the screen 201. or a damage on the screen 201 can be caused. In that case, the right pressure roller 71 and the left pressure roller 72 should be slid from (a) of FIG. 39 to (b) in FIG. 39 to narrow the width between the right pressure roller 71 and the left pressure roller 72.

Embodiment 3.

In FIG. 7, the pressure squeegee 61 and the scraper 311 are unified (attached together or combined). The main squeegee 63 and the scraper squeegee 65 are also unified.

The scraper 311 is attached for allowing rotary movement by a rotary unit 67 in a direction of arrow U or arrow V. The rotary unit 67 is attached to the slider 106 for allowing up and down movement. As illustrated in (a) of FIG. 7, the rotary unit 67 rotates in the direction of arrow V during printing. The angle θ1 between the work 110 and the pressure squeegee 61 is set at 85 degree, for example. As illustrated in (b) of FIG. 7, when the ink is returned by the scraper 311, the rotary unit 67 rotates in the direction of arrow U, and an angle θ6 is set at 90 degree approximately.

As stated, by unifying the pressure squeegee 61 and the scraper 311, a distance between the pressure squeegee 61 and the main squeegee 63 can be narrowed. Hence, a size of an apparatus can be reduced.

In case that the main squeegee 63 and the scraper squeegee 65 are unified, an angle between the squeegee and the work (or screen) should be θ2<θ3 as described in Embodiment 1.

Since the main squeegee 63 and the scraper squeegee 65 are unified, a distance between the main squeegee 63 and the scraper squeegee 65 can be narrowed. Hence, a size of the apparatus can be reduced. Further, a number of parts can be reduced.

In FIG. 8, the pressure squeegee 61 and the scraper 311 are unified.

The scraper 311 is attached to the slider 106 for allowing up and down movement. The pressure squeegee 61 is attached to the scraper 311 for allowing up and down movement by an air cylinder 69. As illustrated in (a) of FIG. 8, during printing, the pressure squeegee 61 moves down while the scraper 311 is up, and the angle θ1 between the work 110 and the pressure squeegee 61 is set at 85 degree, for example. As illustrated in (b) of FIG. 8, in case that the scraper 311 returns the ink, the pressure squeegee 61 is lifted up, and the scraper 311 moves down. The angle θ6 is set at 90 degree approximately.

As stated, since the pressure squeegee 61 is attached to the scraper 311 for allowing movement, a size of the slider 106 can be reduced. Hence, a size of the apparatus can be reduced.

It is possible to use a spring, motor, screw, etc. instead of the air cylinder 69 for attaching the pressure squeegee 61 for allowing up and down movement. It is also possible to allow rotary movement of the scraper 311 as in FIG. 7.

As illustrated in FIG. 40, the pressure roller 70 (right pressure roller 71 and left pressure roller 72) can be unified with the scraper 311.

Embodiment 4.

Figure 9:
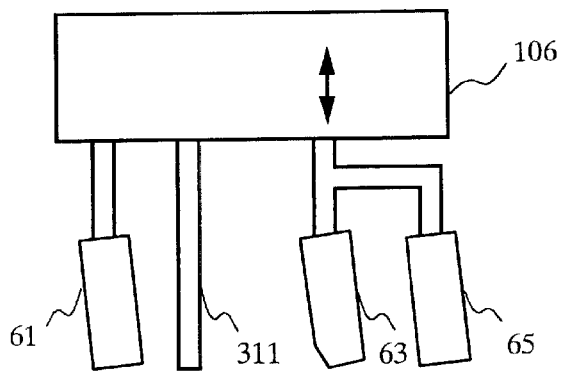
FIG. 9 illustrates squeegees which can move vertically together in the screen printer according to this invention.
Figure 10:
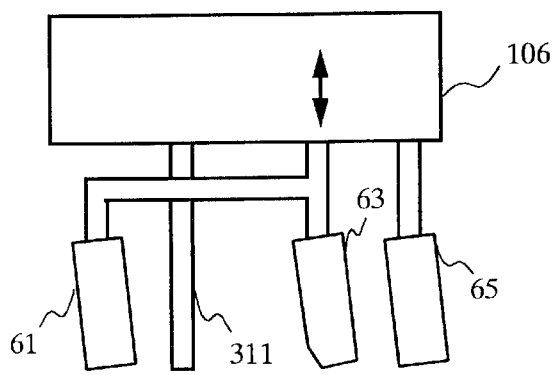
FIG. 10 illustrates squeegees which can move vertically together in the screen printer according to this invention.
Figure 11:
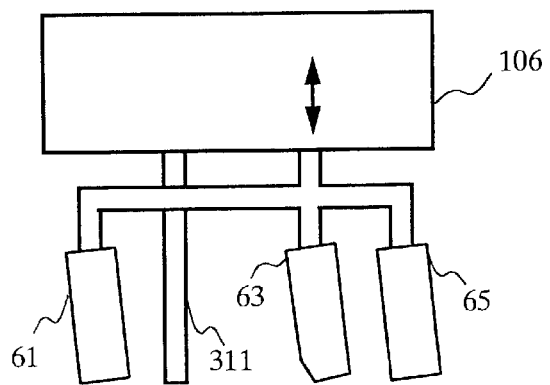
FIG. 11 illustrates squeegees which can move vertically together in the screen printer according to this invention.
Figure 12:
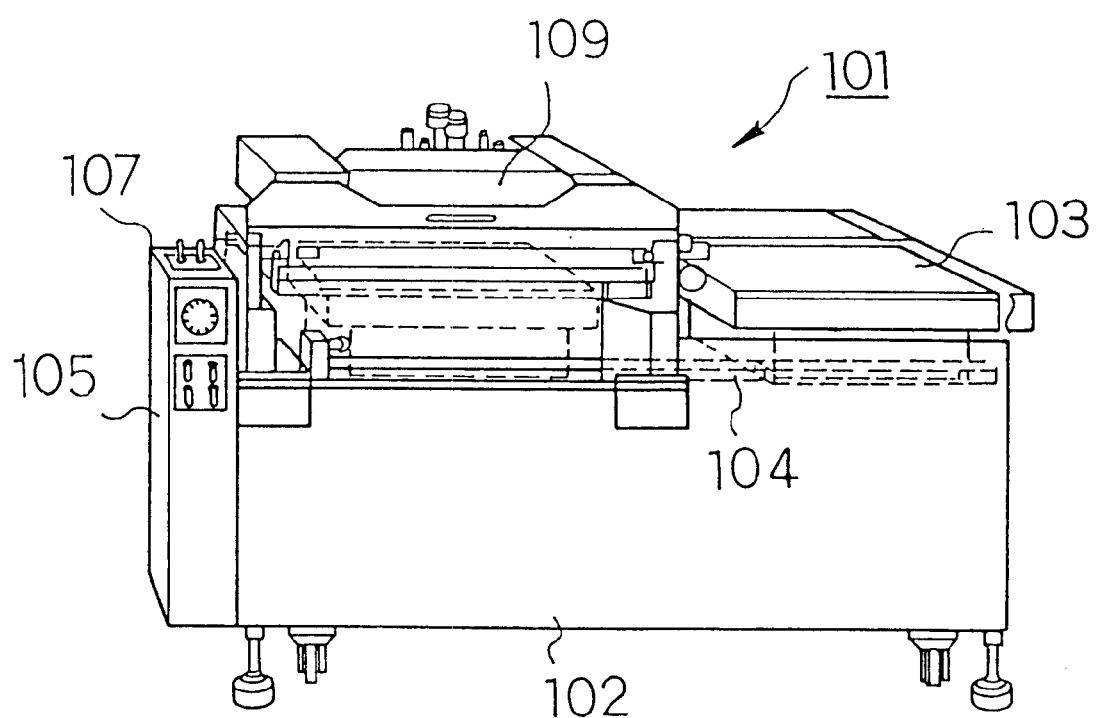
FIG. 12 illustrates a perspective view of the screen printer according to the related art.
Figure 13:
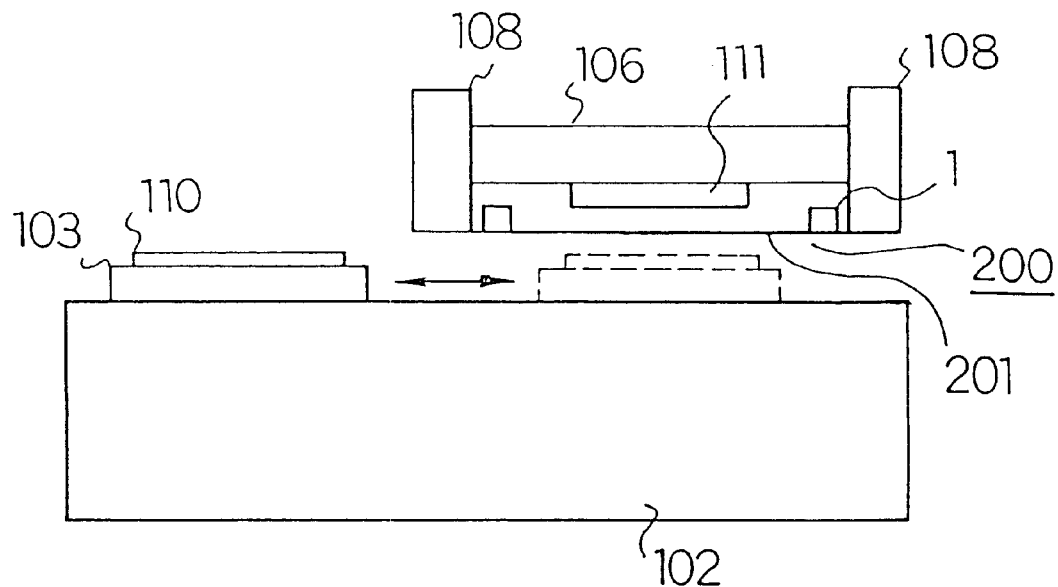
FIG. 13 illustrates a schematic front view of the screen printer according to the related art.
Figure 14:
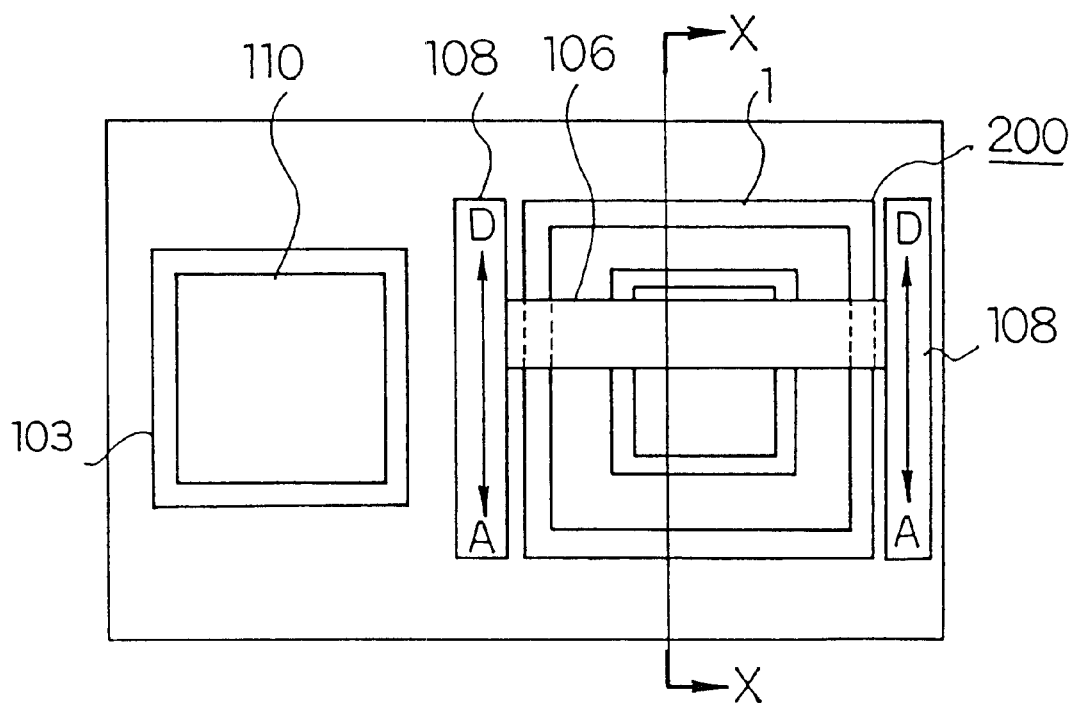
FIG. 14 illustrates a schematic top view of the screen printer according to the related art.
Figure 15:
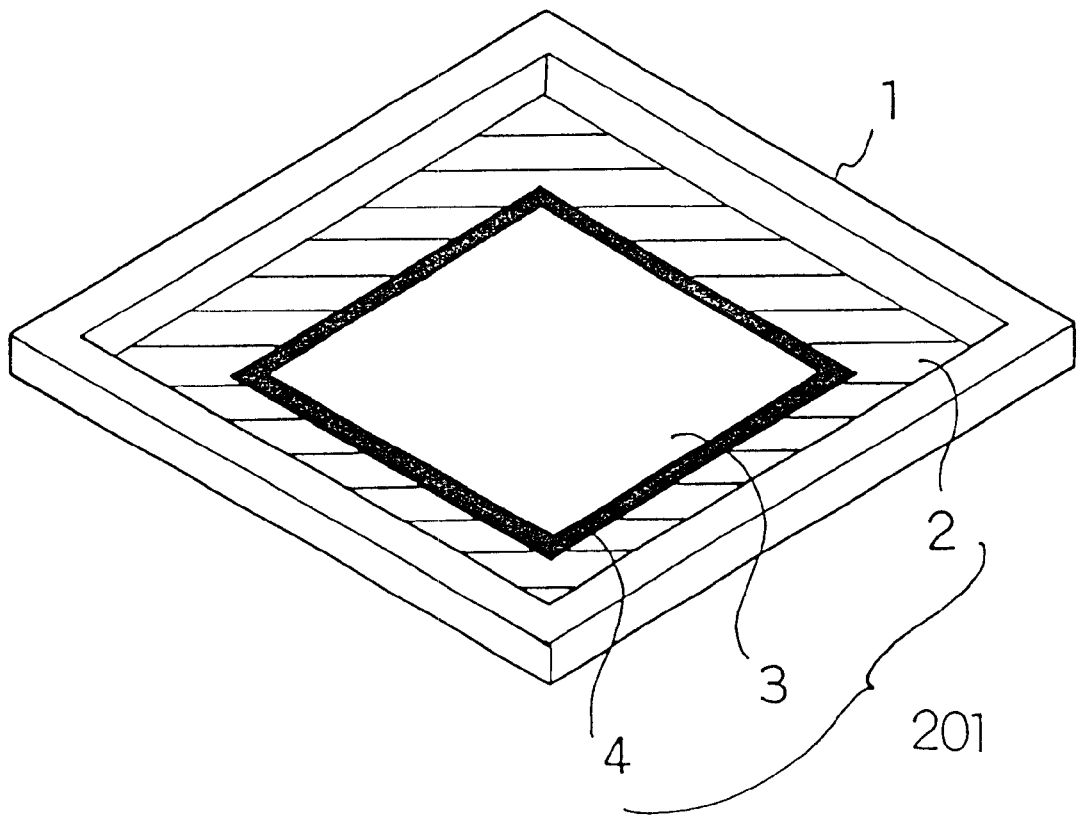
FIG. 15 illustrates a perspective view of the screen plate according to the related art.
Figure 16:
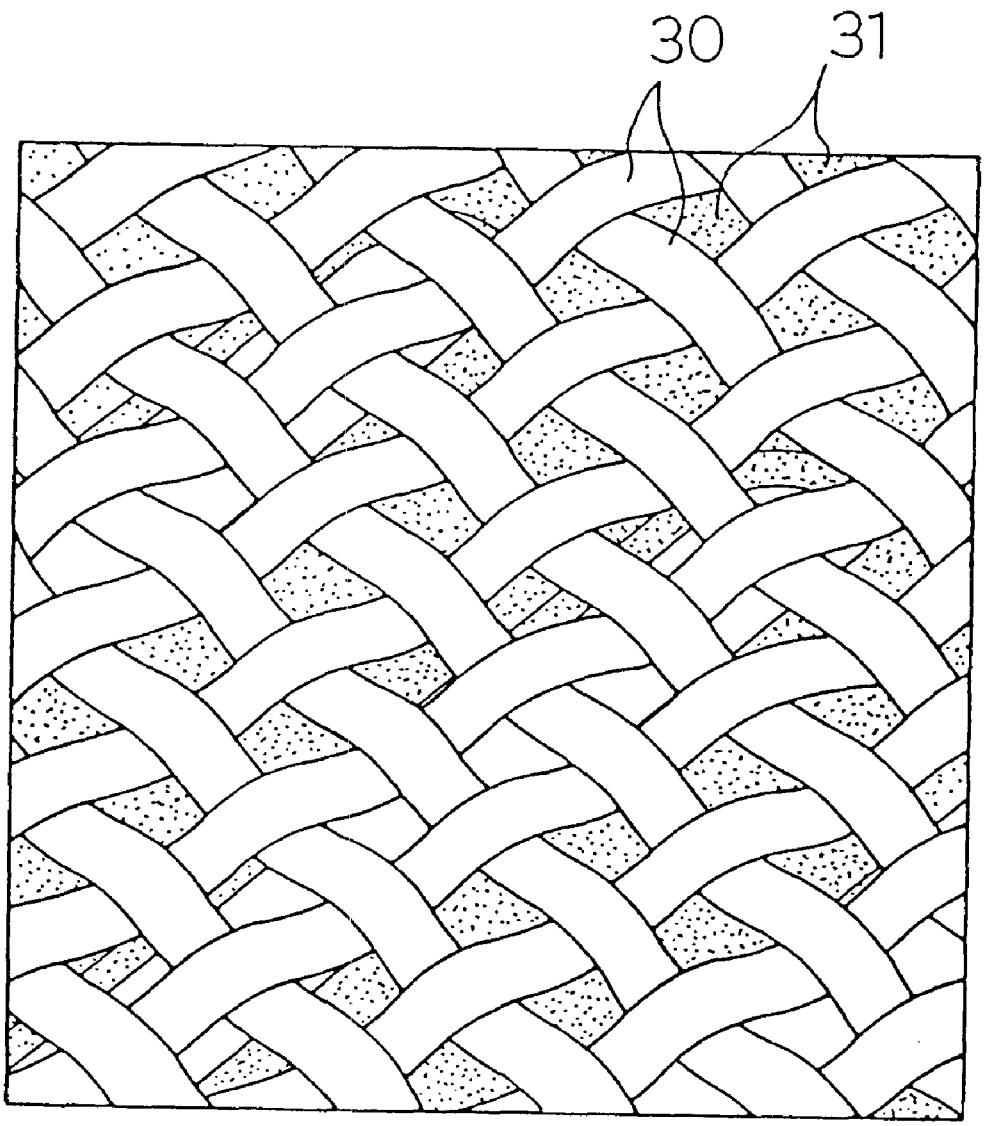
FIG. 16 illustrates a magnified view of a front surface of a screen according to the related art.
Figure 17:
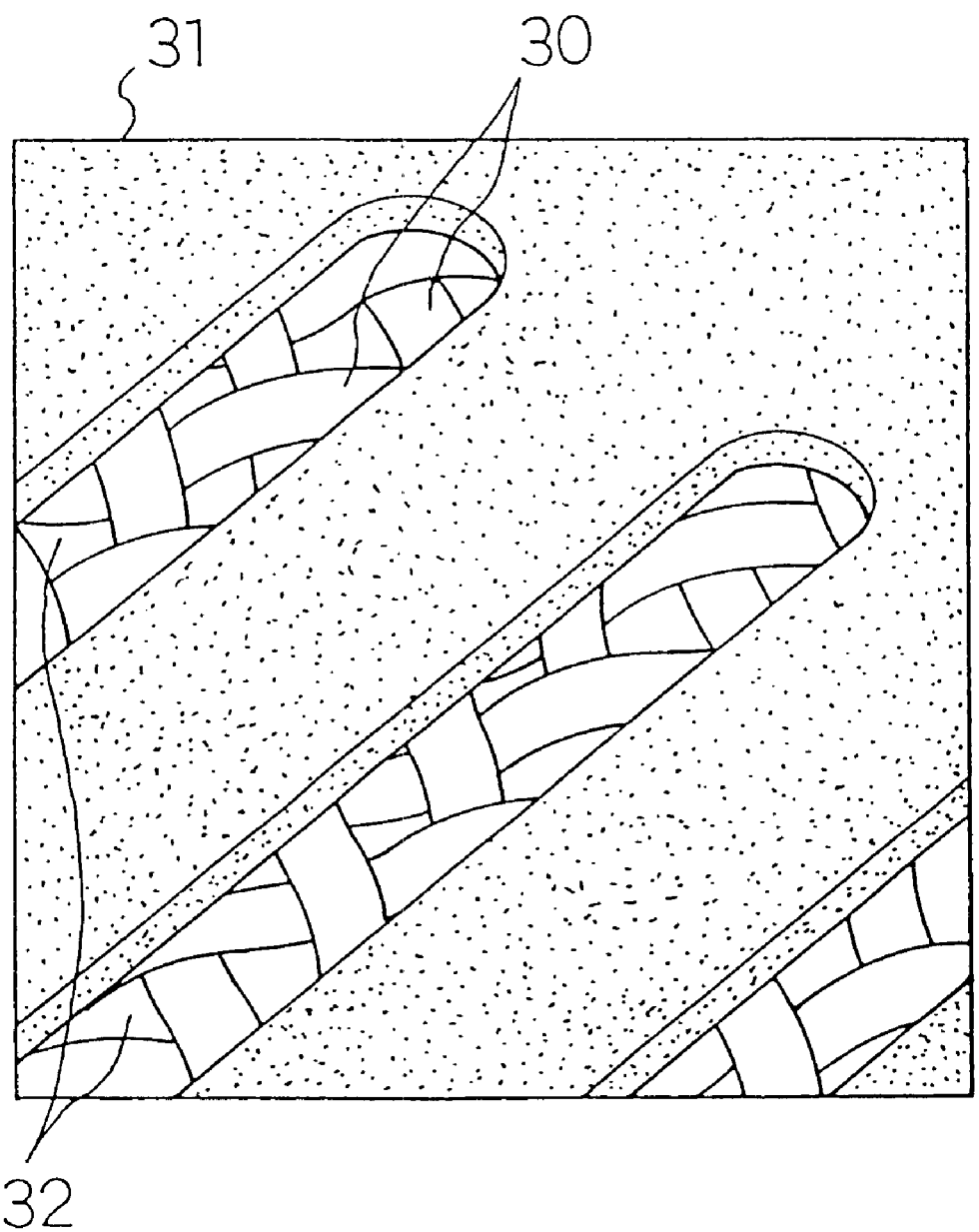
FIG. 17 illustrates a magnified view of a back surface of the screen according to the related art.
Figure 18:
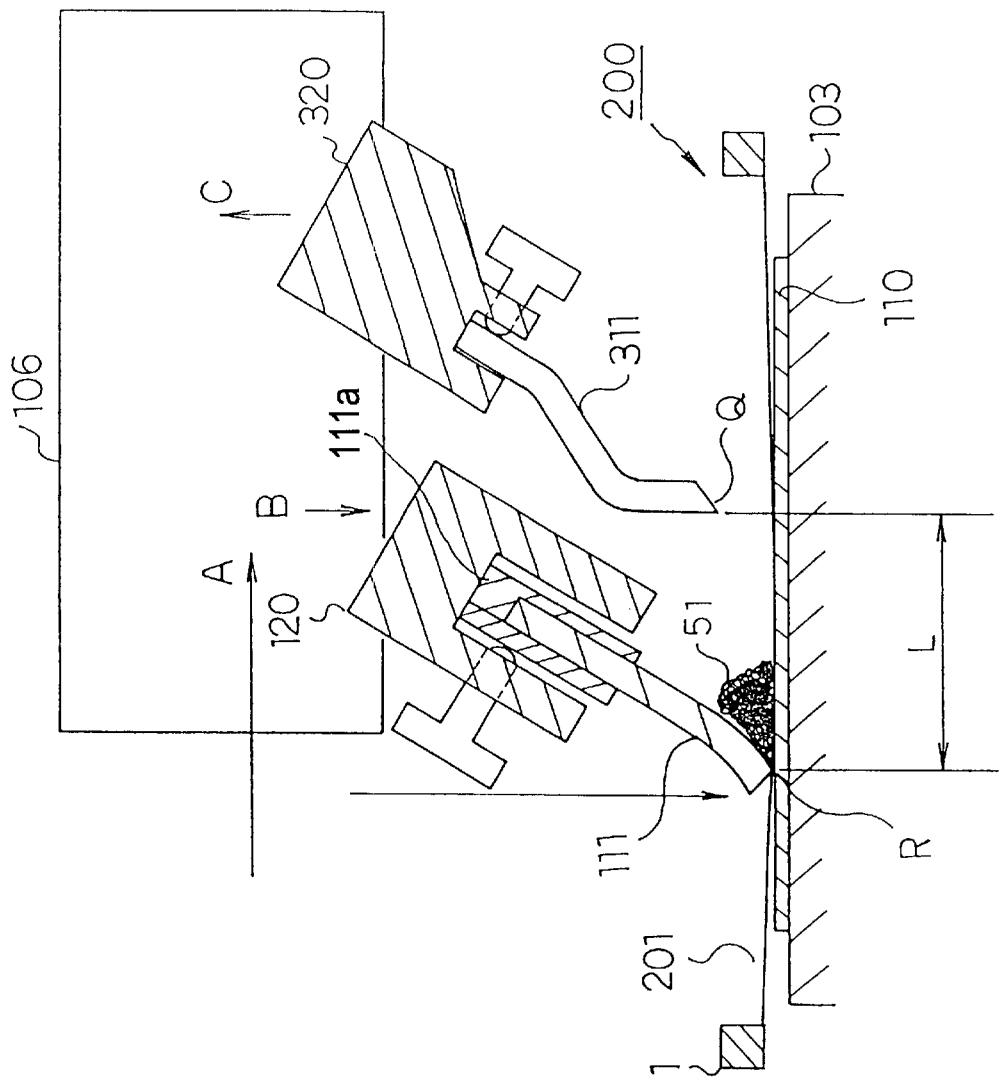
FIG. 18 illustrates an operation of screen printing according to the related art.
Figure 19:
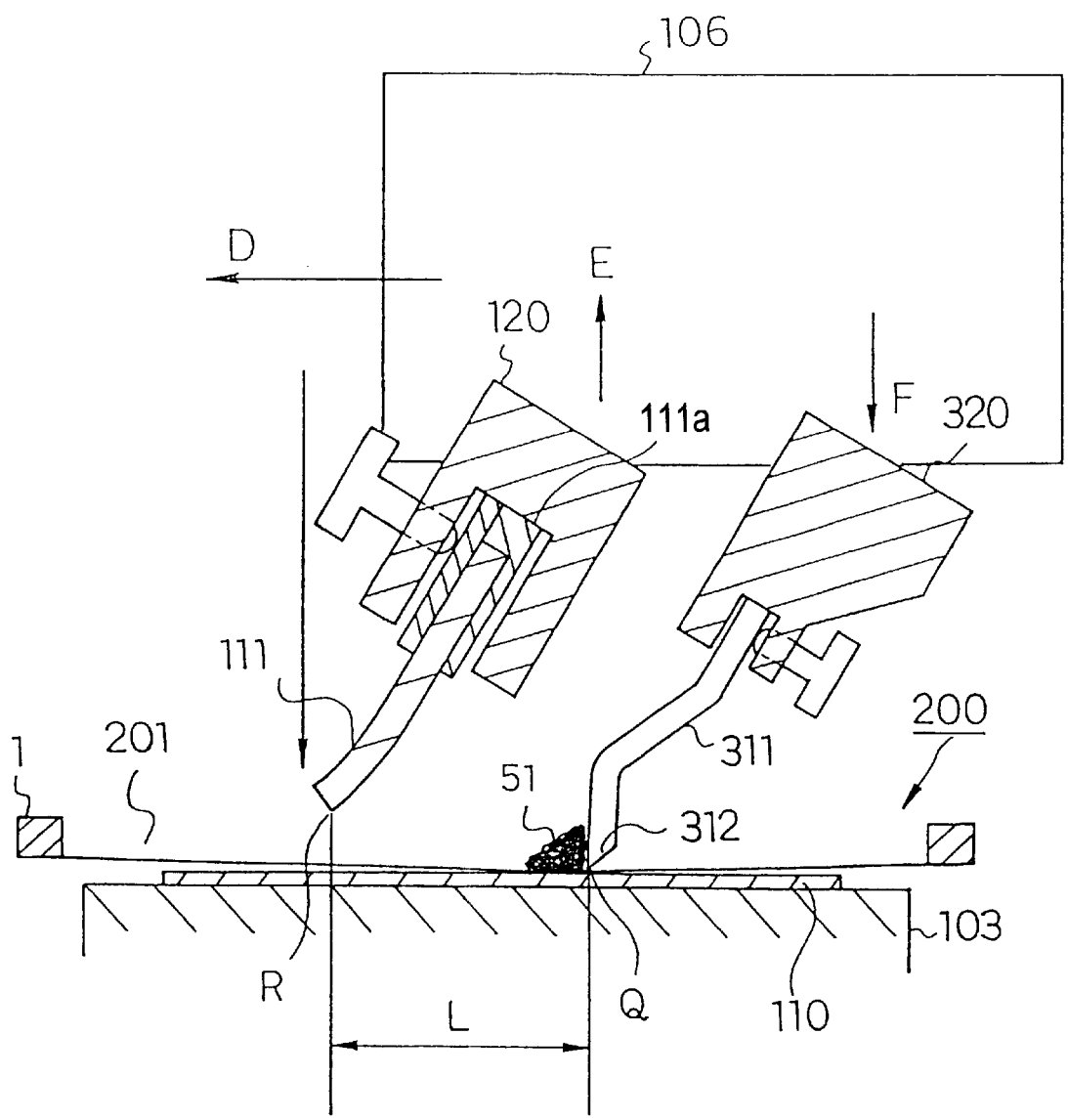
FIG. 19 illustrates an operation of a scraper according to the related art.
Figure 20:
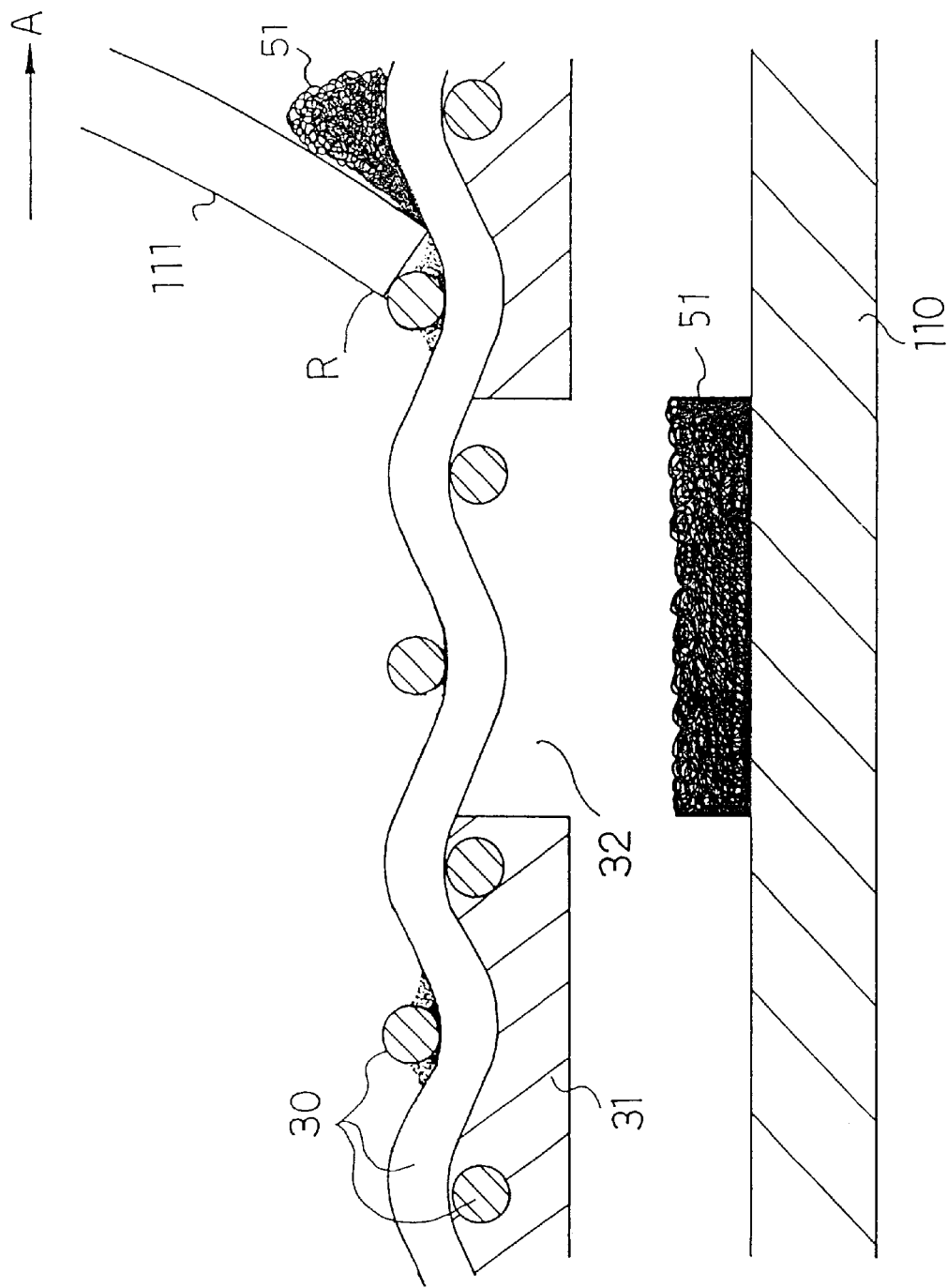
FIG. 20 shows an explanatory chart of the operation of screen printing according to the related art.
Figure 21:
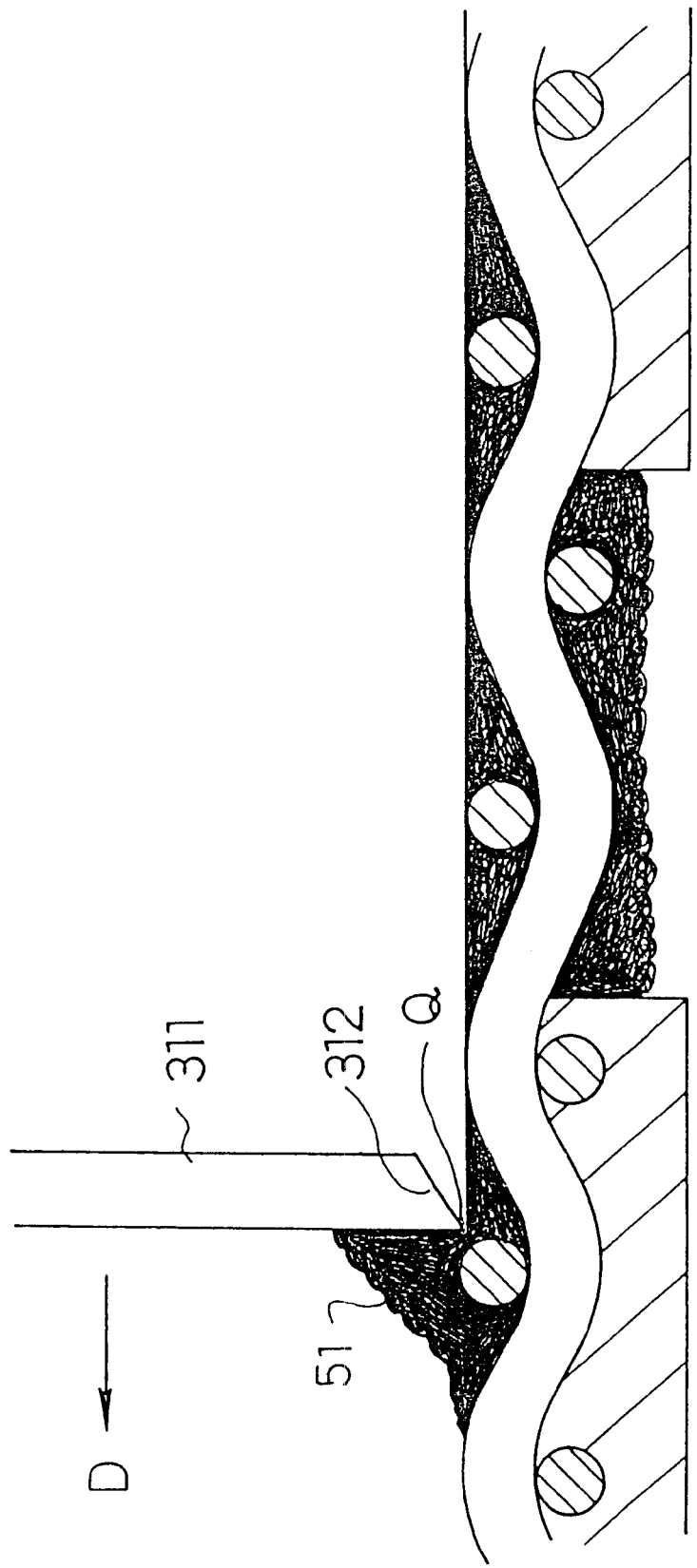
FIG. 21 shows an explanatory chart of the operation of the scraper according to the related art.

In FIGS. 9, 10 and 11, a plurality of squeegees moves up and down together.

In FIG. 9, the main squeegee 63 and the scraper squeegee 65 move up and down together. In FIG. 10, the pressure squeegee 61 and the main squeegee 63 move up and down together. In FIG. 11, the pressure squeegee 61, the main squeegee 63 and the scraper squeegee 65 move up and down together.

In each case, the apparatus can be made simply.

Figure 41:
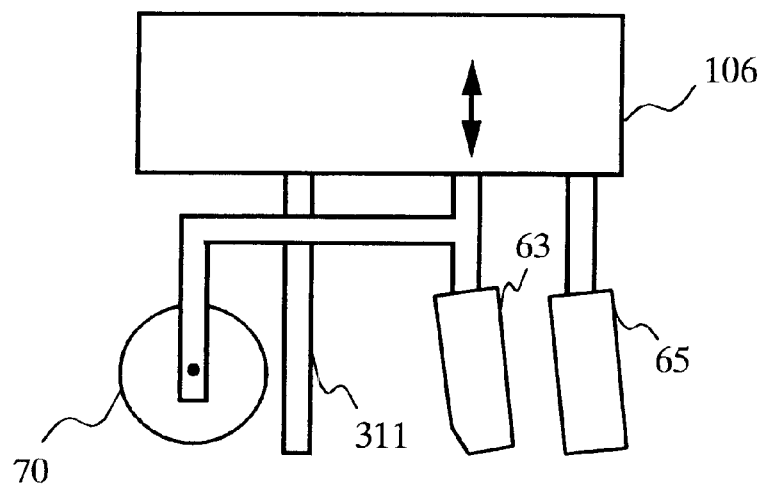
FIG. 41 illustrates the pressure roller 70 which can move vertically together according to this invention.
Figure 42:
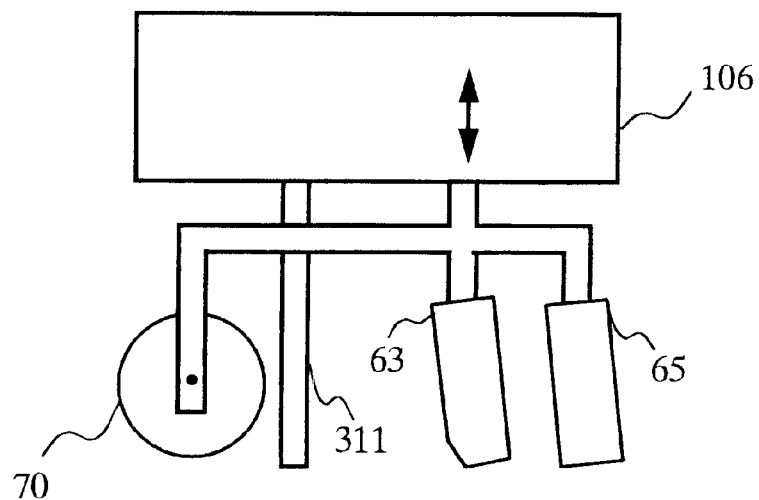
FIG. 42 illustrates the pressure roller 70 which can move vertically together according to this invention.

It is also possible to make the pressure roller 70 (right pressure roller 71 and left pressure roller 72) move together with some other squeegee as illustrated in FIGS. 41 and 42.

It is not necessary that the pressure squeegee 61 and the scraper squeegee 65 are called as the squeegees. They can be replaced by other things with a pressure function or a scraper function.

It is not necessary that the pressure unit is the roller. It can be replaced by a squeegee or a slider which simply slides on the surface of the screen 201 in pressing. The pressure unit can be replaced by anything as far as it presses the screen 201.

Embodiment 5.

Figure 43:
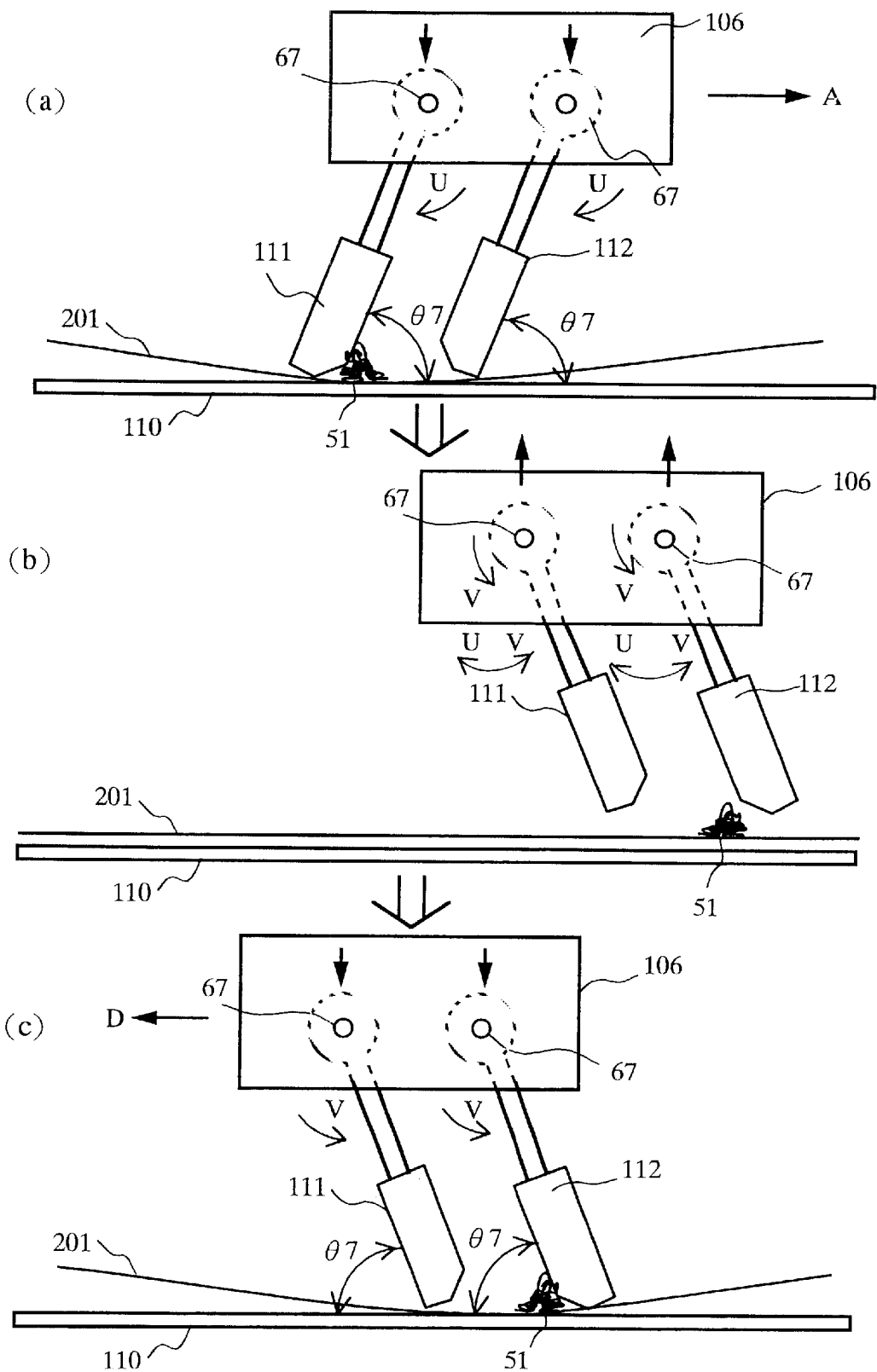
FIG. 43 illustrates a printing method using two squeegees according to this invention.

FIG. 43 illustrates the screen printer using two squeegees.

An apparatus in FIG. 43 differs from the apparatus in FIGS. 24 and 25. In FIG. 43, the squeegees 111 and 112 are used together successively to print one area on a screen for one stroke. In case of FIG. 24, only one squeegee is used for one stroke. In case of FIG. 25, each of squeegees prints different area. In FIG. 43, the squeegees 111 and 112 are attached for allowing rotary movement in the directions of arrow U or arrow V by the rotary units 67 as illustrated in FIG. 7. The rotary units 67 are attached to the slider 106 for allowing up and down movement. When printing is performed in the direction of arrow A in (a) of FIG. 43, the squeegee 112 is the pressure squeegee 61 and the squeegee 111 is the main squeegee for printing. When printing in the direction of arrow A is finished, the rotary units 67 rotate in the direction of V as illustrated in (b) of FIG. 43. When printing is performed in the direction of arrow D as in (c) of FIG. 43, the squeegee 111 is the pressure squeegee, and the squeegee 112 is the main squeegee. An angle of the rotary movement should be 10–20 degree, i.e., an angle θ7 should be 80–95 degree. The angle θ7 of the pressure squeegee is set at 80–95 degree for preventing the pressure squeegee from performing printing as much as possible. The angle of the pressure squeegee should be close to 90 degree, if possible, for preventing the printing by the pressure squeegee.

Embodiment 6.

The scraper 311 and the pressure 61 in the stated arrangement can be replaced each other.

Figure 44:
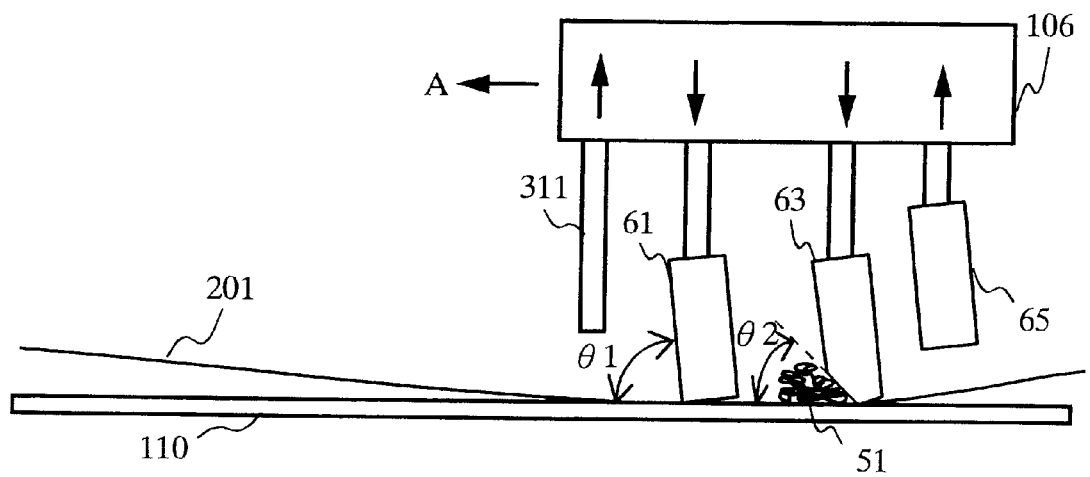
FIG. 44 illustrates a printing state of the screen printer according to this invention.
Figure 45:
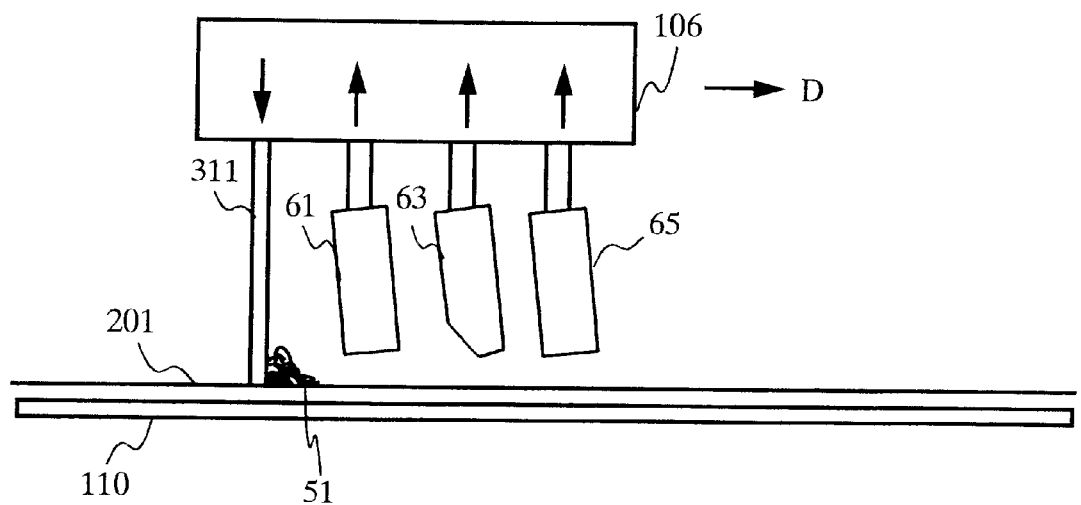
FIG. 45 illustrates a printing state of the screen printer according to this invention.
Figure 46:
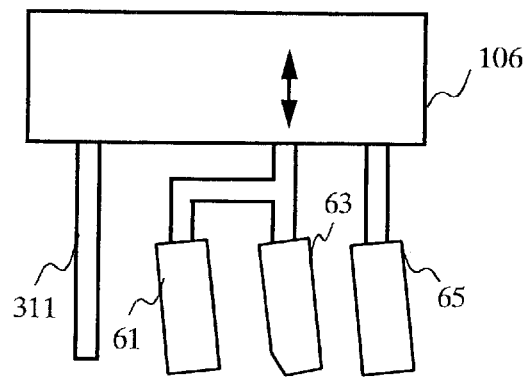
FIG. 46 illustrates the squeegees which can move vertically together according to this invention.
Figure 47:
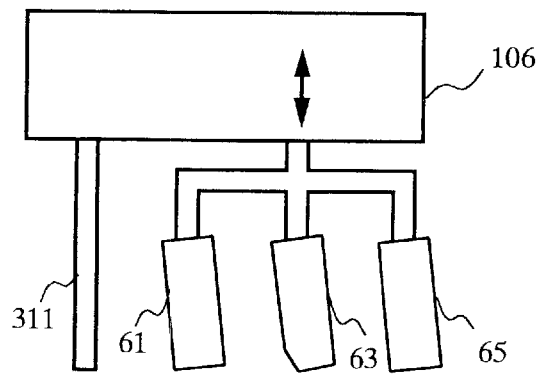
FIG. 47 illustrates the squeegees which can move vertically together according to this invention.
Figure 48:
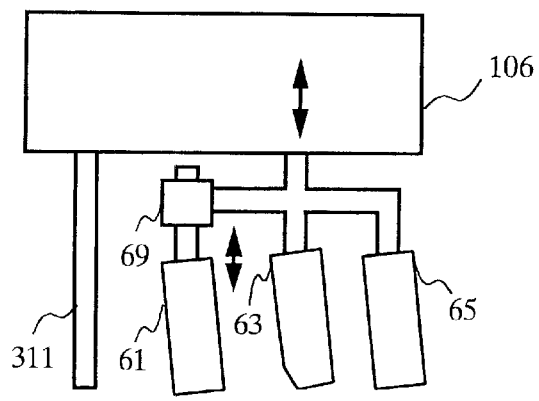
FIG. 48 illustrates the squeegees which can move vertically against the main squeegee in the screen printer according to this invention.

In FIG. 44, the scraper 311 and the pressure squeegee 61 in FIG. 2 are replaced each other. In FIG. 45, the scraper 311 and the pressure squeegee 61 in FIG. 5 are replaced each other. It is also possible that the pressure squeegee 61 and the main squeegee 63 are moved unitedly as illustrated in FIGS. 46 and 47. It is also possible to allow up and down movement of the pressure squeegee 61 independently from the main squeegee 63 by the air cylinder 69 as illustrated in FIG. 48.

Figure 49:
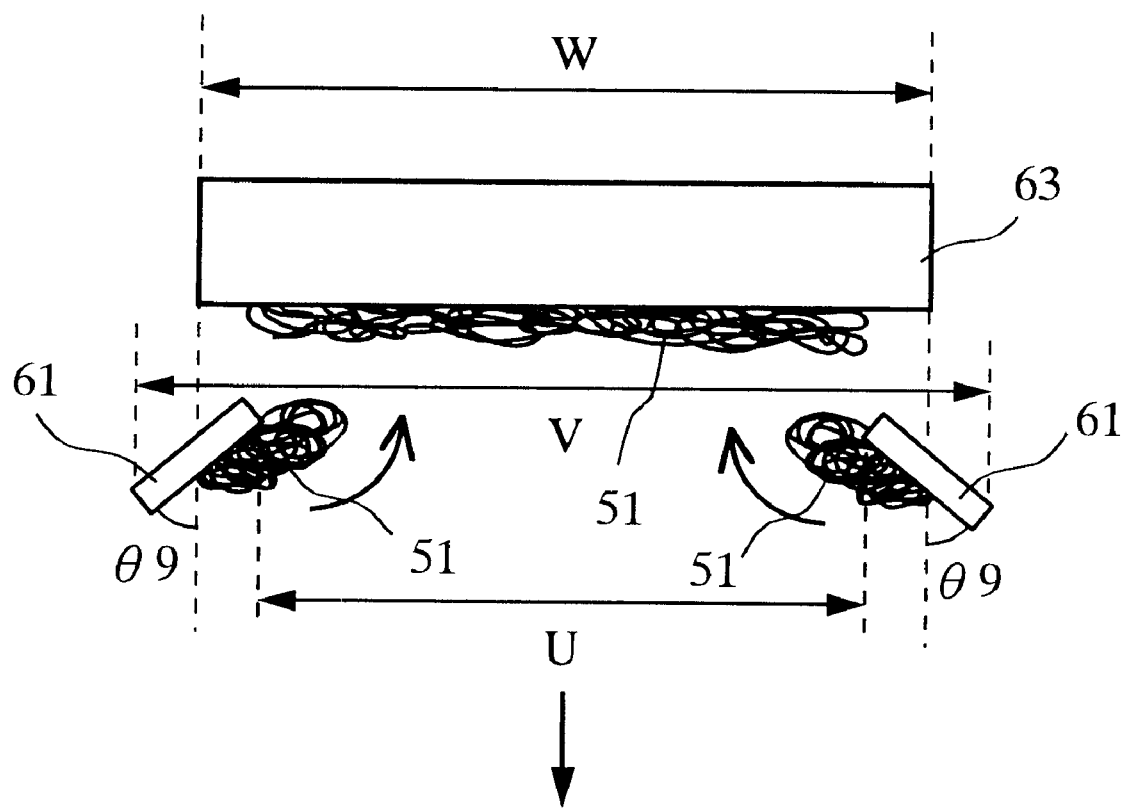
FIG. 49 illustrates a top view of the pressure squeegee 61 and main squeegee 63 according to this invention.

FIG. 49 illustrates a top view in case that the pressure squeegee is divided into left and right.

The pressure squeegee 61 has an angle θ9 against the printing direction. By making the angle θ9 smaller than 90 degree, the ink 51 is gathered in a center of the main squeegee 63 as shown in arrows. In this way, leakage of the ink 51 from both sides of the main squeegee 63 is prevented, and shortage and lack of the ink 51 can be prevented.

Even though an illustration is not provided, the scraper 311 and the pressure roller 70 (right pressure roller 71 and left pressure roller 72) in the stated arrangement can be replaced each other.

Embodiment 7

Explanations are made on a pre-contact printing method with a low pressure by using a solder paste (the ink is also called as the paste.).

Since the solder paste contains solder particles with a larger diameter than other types of paste for screen printing, a mask (metal mask) (the screen is also called as the mask) without mesh is normally used for printing by using the solder paste. Therefore, in printing by using the solder paste, it is difficult to use a basic method for screen printing, i.e., "off-contact printing method." In the "off-contact printing method", a constant clearance is maintained between the mask and the work, and a line contact is created by the squeegee for the mask and the work.

Figure 50:
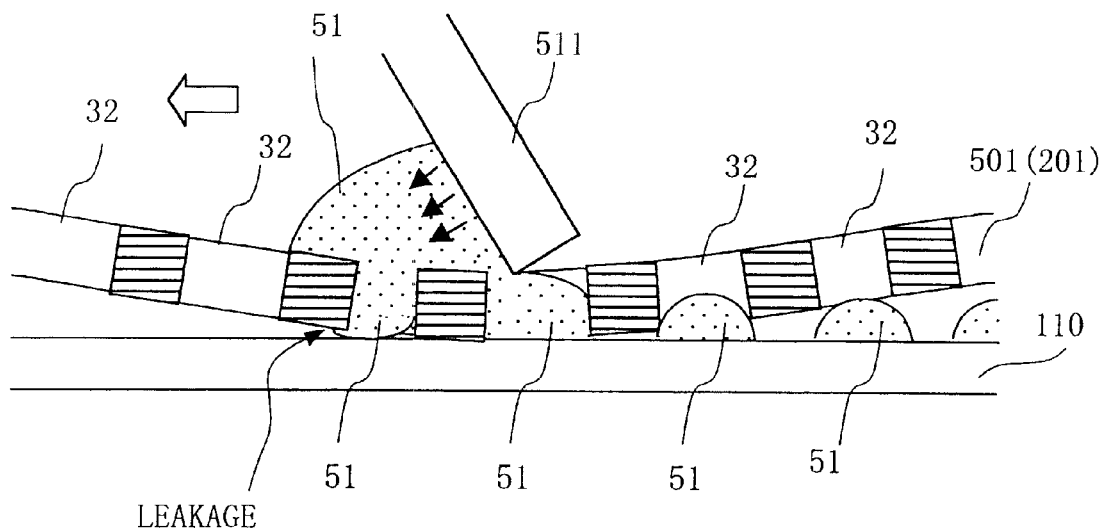
FIG. 50 illustrates a leakage of the paste in the "off-contact printing method"

FIG. 50 illustrates a leakage of the paste in the "off-contact printing method."

As illustrated in FIG. 50, the paste 51 (the ink is also called as the paste.) is flowed by a squeegee 511, and pushed toward a lower forward direction, i.e., a direction vertical to a surface of the squeegee. However, since a mask 501 is without mesh, the paste tends to be leaked from the opening 32 of the mask. The paste 51 is also pressed and flowed at a place which is a few millimeter ahead of the contacting line of the screen 201 and the work 110, and leaked from the opening 32 of the mask. Since there is a certain space between the screen 201 and the work 110, the paste 51 tends to be spread largely. Therefore, the "off-contact printing method" is not used in a surface mount technology (SMT).

Figure 51:
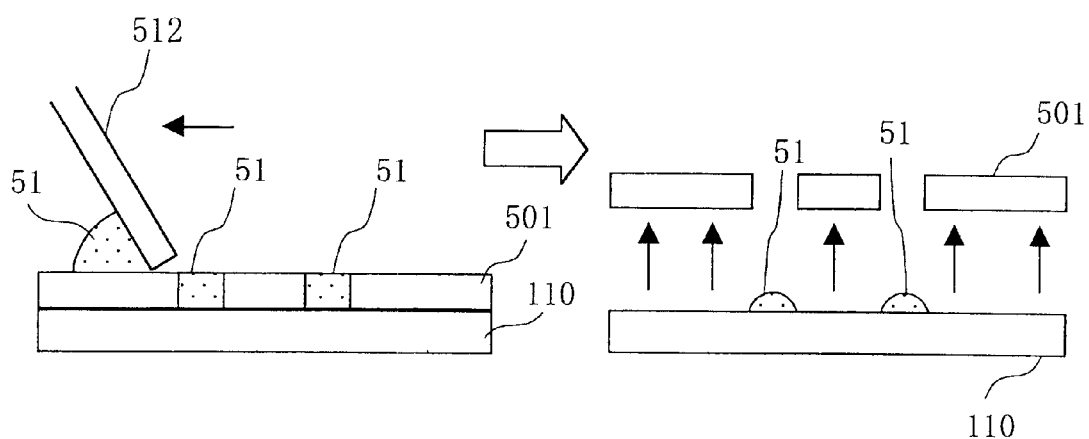
FIG. 51 illustrates squeezing and detaching of the mask in the "on-contact printing method"

In the SMT, an "on-contact printing method" is mainly used in the printing by using the solder paste. FIG. 51 illustrates squeezing and detaching of the mask in the "on-contact printing method." As illustrated in FIG. 51, a surface contact of the metal mask 501 and the work 110 is created and squeezed. Then, the opening is filled with the paste 51. After a constant time is passed, the metal mask 501 and the work 110 are detached mechanically (detached from the mask). In this method, the paste is not leaked during squeezing.

In the "on-contact printing method", even if the opening of the mask is with a various diameter, the opening can be filled with the paste evenly. Hence, the "on-contact printing method" is recommended by many manufacturers of solder paste printers and adopted by most of the solder paste printer users.

However, since the metal mask 501 and the work 110 are contacted each other for a long time, the paste often spreads due to capillary. Further, since the mask is detached, when the paste becomes less flowing, the paste 51 tends to remain in the opening of the mask. Especially in a fine pitch printing, the evenness tends to drop. Further, when a large area is printed, since the paste is sticky, a condition of detaching of the mask at a center of the metal mask and a condition of detaching of the mask at a point close to a circumference of the metal mask differ. Hence, it is very difficult to print evenly. Further, a metal squeegee 512 damages the metal mask 501.

Explanations are made on a pre-contact printing method with a low pressure.

In Embodiment 7, the "pre-contact printing method" with a low pressure by using a rubber squeeze is used to solve the above-stated problems in printing by using the solder paste.

Figure 52:
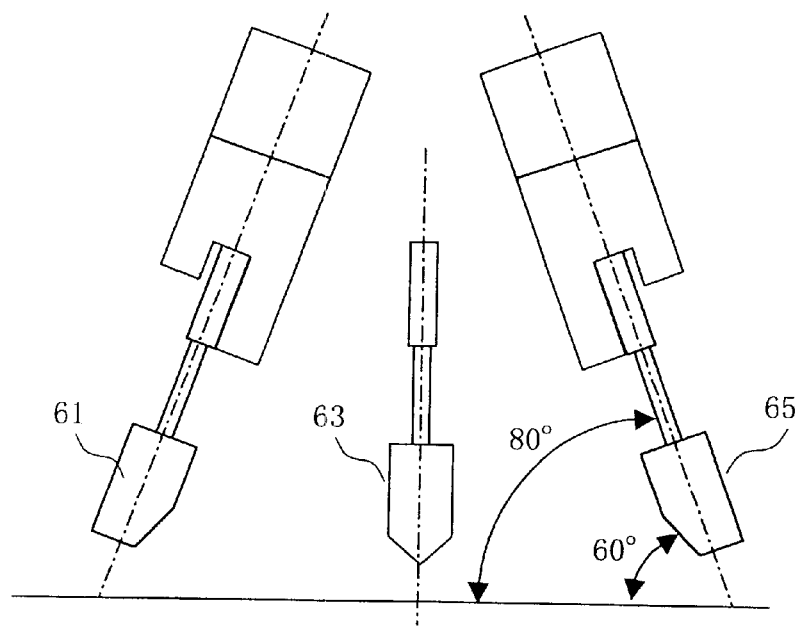
FIG. 52 illustrates a configuration of a pre-contact squeegee.
Figure 53:
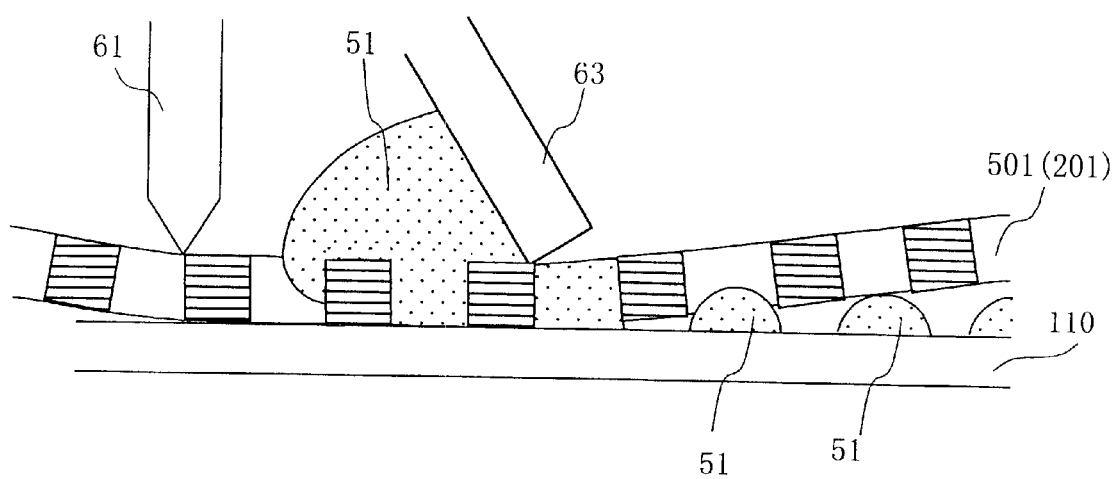
FIG. 53 illustrates a configuration of the pre-contact squeegee.

FIGS. 52 and 53 illustrate a configuration of a pre-contact squeegee.

As illustrated in FIGS. 52 and 53, in the "pre-contact printing method", the pre-contact squeegee 61 (supplementary squeegee) (the pressure squeegee is also called as the pre-contact squeegee.) is provided ahead of the printing squeegee 63 (main squeegee) for making the screen and the work contacted each other. In the "pre-contact printing method", a band contact of the mask and the work is created between the pre-contact squeegee 61 and the printing squeegee 63 to solve the problems in the "off-contact printing method." In this method, it is possible to realize both a good filling condition achieved in the "on-contact printing method" and a continuous detaching of the mask achieved in the "off-contact printing method."

Besides, in case that the rubber squeegee is used, when the rubber squeegee moves on the opening of the metal mask, the rubber squeegee tends to slip in the opening of the metal mask, and scrapes the paste which is already filled in the opening. Therefore, the opening of the metal mask is not filled with the paste sufficiently. The problem of the insufficient filling of the paste in the opening of the metal mask is not caused because the rubber squeegee is used. The problem occurs as an excessive pressure is given to the squeegee. Therefore, the problem can be solved by setting a pressure at a low level and using a rubber squeegee which is polished slantingly.

In the "pre-contact printing method", the paste can be put out of the opening of the mask smoothly without a remaining, and the spread can be reduced. Therefore, it is possible to print continuously without cleaning or washing the mask, that is necessary in regular on-contact screen printing.

Figure 54:
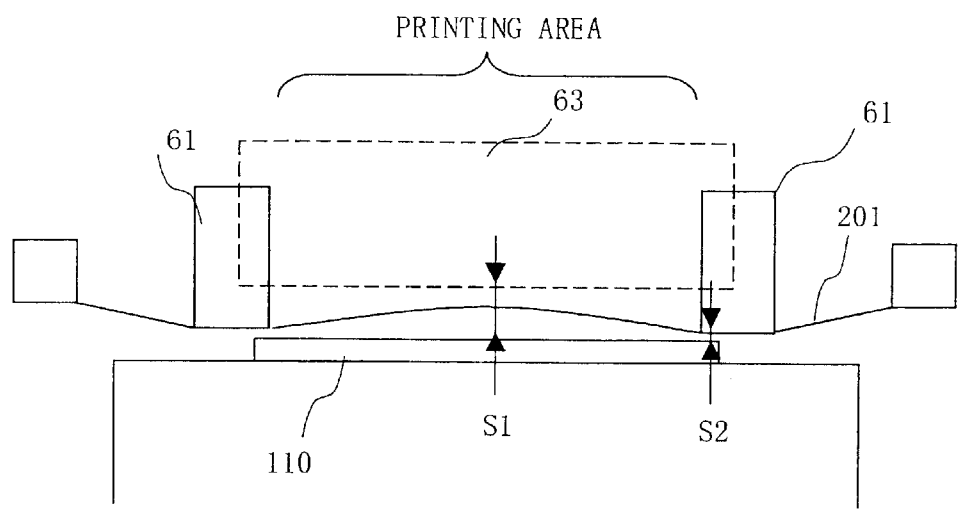
FIG. 54 illustrates a condition of the screen and the work when the pre-contact squeegee is placed downward.

FIG. 54 illustrates a condition of the screen and the work when the pre-contact squeegee is placed downward.

The pre-contact squeegee 61 and the screen 201 are contacted each other outside a printing area. However, as illustrated in FIG. 54, the pre-contact squeegee 61 and the screen 201 are not contacted in the printing area. In the whole printing area, a small space S1 is maintained between the work 110 and the screen 201, that is the work 110 and the screen 201 are not contacted due to a tension of the screen. Because of the small space S1, the paste is not put on a back side of the mask, and the paste is not leaked.

It is also possible to move down the pre-contact squeegee 61 and stop at a point in a middle to maintain a space S2 between the work 110 and the screen 201. By doing so, the work 110 and the screen 201 are not contacted in the whole printing area. The space S2 is not necessary, and the space S1 is maintained anyway even if the space S2 is not maintained.

Embodiment 8.

A phosphor printing by using a two-blade squeegee is explained.

In screen printing, the squeegee has the following three functions:

1) contacting the screen with a substrate;
2) depositing the paste from the opening of the screen; and
3) scraping an excessive paste on the screen.

Figure 55:
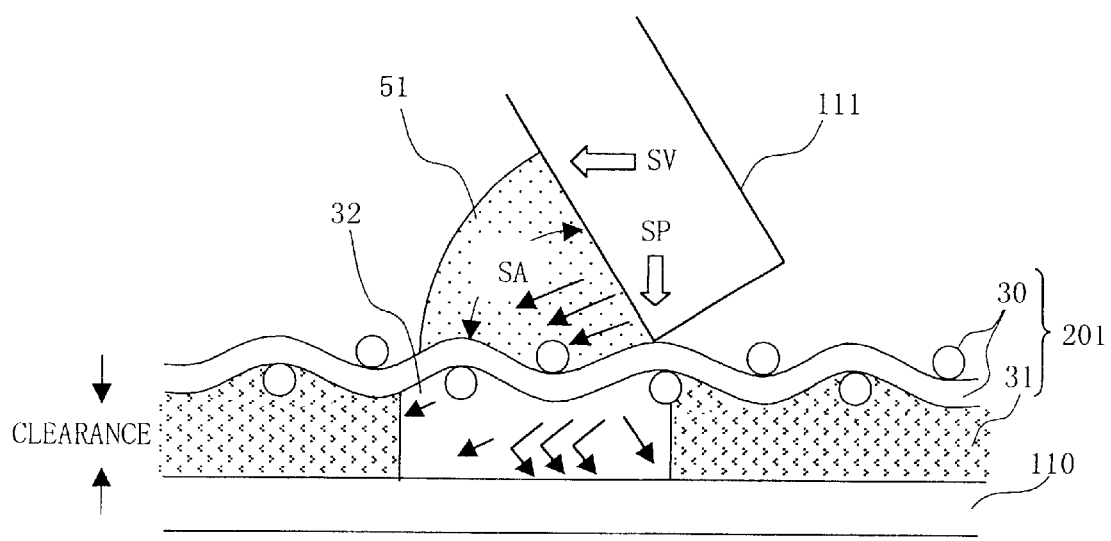
FIG. 55 illustrates a deposition mechanism of the paste.

FIG. 55 illustrates a deposition mechanism of the paste.

In the related art, a pressure (SP), an attack angle (SA), and a squeegee speed (SV) are balanced by using a single squeegee to set a condition of printing.

As illustrated in FIG. 55, a force for depositing the paste 51 from the opening of the screen (deposition force) is generated only when the squeegee moves. A force in a direction vertical to a surface of the squeegee is given to the paste 51, and the force is sent forward.

Figure 56:
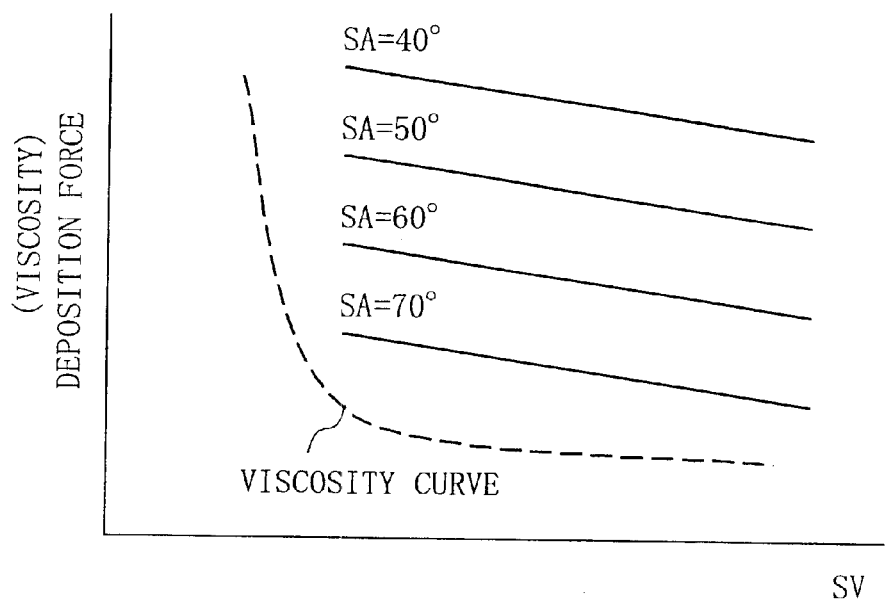
FIG. 56 illustrates the deposition force of the paste and the condition of printing.

FIG. 56 illustrates the deposition force of the paste and the condition of printing.

As illustrated in FIG. 56, when the attack angle SA decreases, the deposition force increases. When the squeegee speed SV decreases, the force is given to the paste for a longer time, and the "deposition force" increases.

A phosphor printing method in a plasma display panel (PDP) and its problems are stated.

Figure 57:
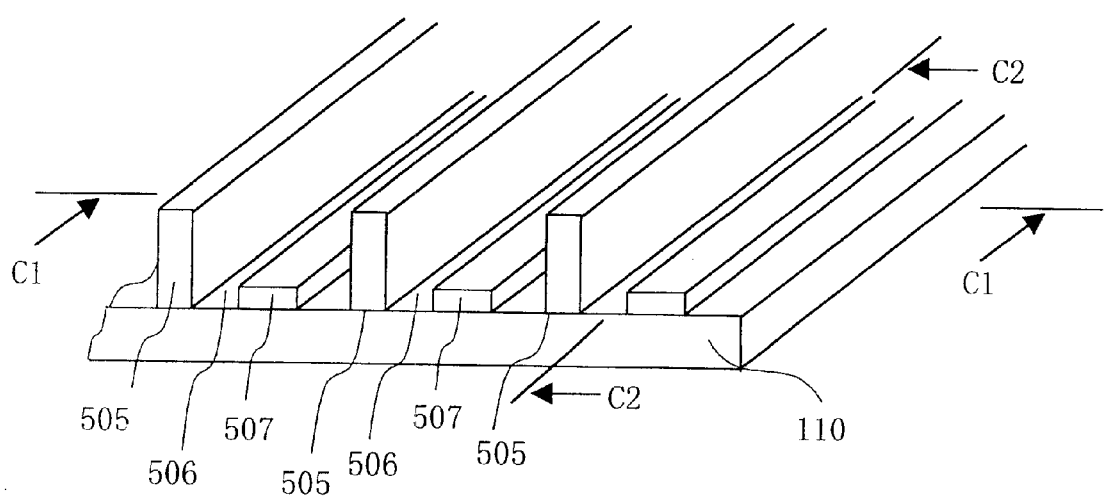
FIG. 57 illustrates a plasma display panel in phosphor printing.

As illustrated in FIG. 57, in the phosphor printing, the paste must be dropped in a gutter 506 including electrode 507 between barrier ribs 505 with a height of 130 μm or more. Therefore, it is necessary to set the "deposition force" at a high level.

Specifically, the attack angle is often set at 15–20°, and the squeegee speed is often set at 30–60 mm/sec. This condition is modified based on types of the paste and the screen, and a filling amount of the phosphor is controlled. When the amount of the phosphor is insufficient, a brightness drops, and an uneven display is caused. When a deposition force is too much, an overflow of the paste is caused. Further, the phosphor sticks to a top of the barrier ribs 505, and colors are mixed beyond the barrier rib. Therefore, the back side of the screen 201 must be often cleaned. The overflow of the phosphor during printing must be prevented to reduce a frequency of cleaning of the back side of the screen 201.

Figure 58:
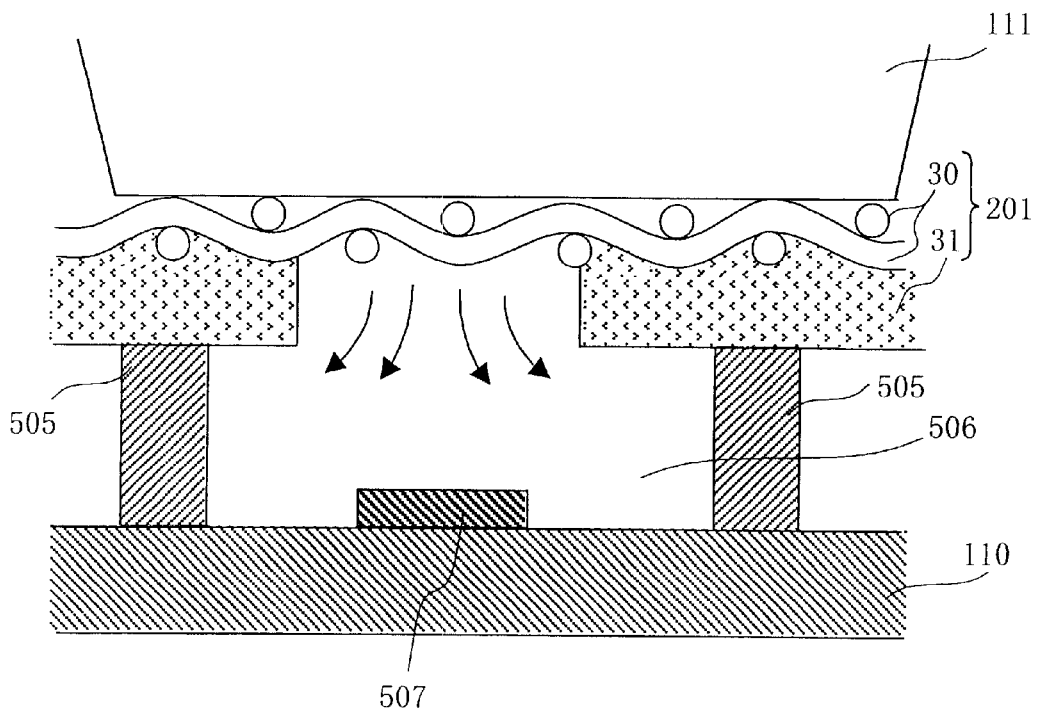
FIG. 58 illustrates a relationship of the screen and the barrier ribs during the phosphor printing.

FIG. 58 illustrates a relationship of the screen and the barrier ribs during the phosphor printing.

FIG. 58 illustrates a relationship of the squeegee 111, the screen 201, and the substrate 110 (the work is also called as the substrate) at a C1—C1 section in FIG. 57.

Figure 59:
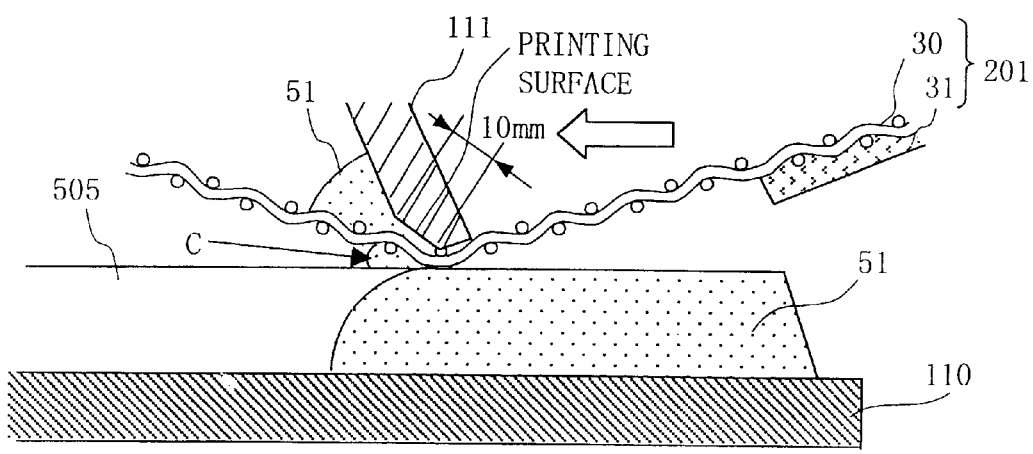
FIG. 59 illustrates a relationship of the screen, squeegee, and barrier ribs during the phosphor printing and the leakage of the paste.

FIG. 59 illustrates a relationship of the screen, squeegee, and barrier ribs during the phosphor printing and the leakage of the paste.

FIG. 59 illustrates a side view of the phosphor printing at a C2—C2 section in FIG. 57. Since the attack angle of the squeegee is small, the "deposition force" is high, and the paste flows in a lower forward direction. Since a printing surface of the squeegee is with a length of 10 mm approximately as shown in FIG. 59, a gutter is filled with the paste a few millimeters ahead of a contacting point. Since a small clearance C is maintained between the screen and the substrate in an area which is a few millimeters ahead in a direction of movement of the squeegee, there is a possibility that the paste 51 is leaked in the small clearance C. The back side of the screen is cleaned to get rid of the leaked paste. Therefore, if the overflow is prevented, the frequency of cleaning of the back side can be reduced.

Figure 60:
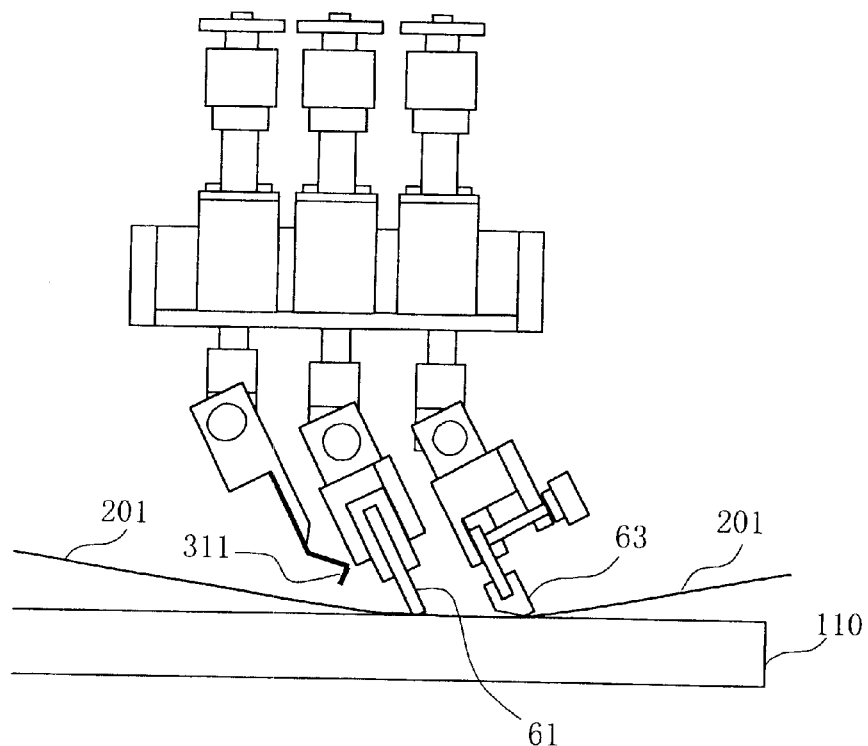
FIG. 60 illustrates a configuration of a two-blade squeegee in Embodiment 8.

FIG. 60 illustrates a configuration of a two-blade squeegee in Embodiment 8. An angle of the supplementary squeegee 61 (the pre-contact squeegee is also called as the supplementary squeegee.), which is provided ahead, is 70–85°. The supplementary squeegee is used to make the screen 201 and the substrate 110 contacted each other.

Figure 61:
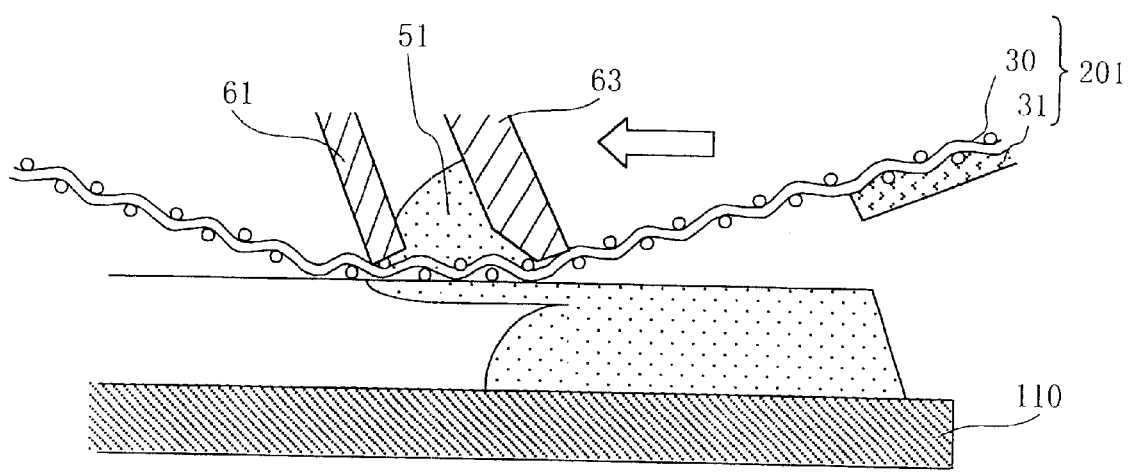
FIG. 61 illustrates an actual phosphor printing.

FIG. 61 illustrates a preventing method of the overflow of the paste by using the two-blade squeegee.

FIG. 61 illustrates an actual phosphor printing.

In this case, when the attack angle of the supplementary squeegee 61 is 70–85°, the paste 51 goes through the screen 201 and just appears on the back side of the screen 201. Therefore, the paste 51 does not affect printing by the main squeegee 63.

The screen is contacted with the barrier ribs by the supplementary squeegee 61 which is ahead. The gutter is covered by the screen in advance, and filled with the phosphor by the main squeegee 63. Therefore, the overflow is prevented.

In this method, because there is no possibility of overflow, a paste with relatively low sticking level and higher liquidity can be used. Therefore, it is possible to set a higher squeegee speed. Hence, the throughput can be improved.

The overflow can be prevented by using the two-blade squeegee. Further, since the printing process becomes steady, a variety of pastes can be used. Hence, the quality of coating and the productivity can be improved.

As stated, according to this invention, the screen printer for printing evenly can be realized.

According to the preferred embodiment of this invention, three functions of the squeegee are shared by the plurality of squeegees. Hence, the squeegees effectively formed for achieving each of the functions can be used. Further, printing such as filling out of the through-hole, groove, etc. can be performed efficiently.

Further, since the plurality of squeegees can be controlled individually, the pressure of each of the squeegees can be changed. It is also possible to determine a position for moving up or down for each of the squeegees.

According to the preferred embodiment of this invention, since a plate detaching apparatus is not used, an unnecessary pressure is applied to the screen. Hence, problems such as shifting of a printing position and reduction in durability of the screen plate do not occur.

According to the preferred embodiment of this invention, even if the pressure unit is used instead of the pressure squeegee, same effects can be realized.

According to this invention, since the pressure squeegee or pressure unit is arranged in left and right, the pressure squeegee or pressure unit does not print before printing by the main squeegee. Hence, the main squeegee can perform printing.

Having thus described several particular embodiments of the invention, various alterations, modifications, and improvements will readily occur to those skilled in the art. Such alterations, modifications, and improvements are intended to be part of this disclosure, and are intended to be within the spirit and scope of the invention. Accordingly, the foregoing description is by way of example only and is limited only as defined in the following claims and the equivalents thereto.

What is claimed is:

1. A screen printer for performing screen printing on a work by using a squeegee, comprising:
   a main squeegee for performing screen printing; and
   a supplementary squeegee for supplementing screen printing by the main squeegee during screen printing by the main squeegee,
   wherein the main squeegee is pressed on a screen in a determined angle, wherein the supplementary squeegee is pressed on the screen in an angle exceeding the determined angle,
   wherein the screen printer further comprises a scraper attached at one of a place between the main squeegee and a pressure squeegee and a place ahead of the main squeegee and the pressure squeegee in the printing direction,
   wherein the supplementary squeegee is provided ahead of the main squeegee in a printing direction; wherein the supplementary squeegee is the pressure squeegee for pressing the screen on the work.

2. The screen printer of claim 1, wherein the pressure squeegee is unified with one of the scraper and the main squeegee.

3. A screen printer for performing screen printing, comprising a first squeegee and a second squeegee for moving forward and backward, wherein the first squeegee is a pressure squeegee for pressing the screen and the second squeegee is a main squeegee for performing screen printing in the forward movement, wherein the second squeegee is the pressure squeegee for pressing the screen and the first squeegee is the main squeegee for performing screen printing in the backward movement,
   wherein the main squeegee is pressed on a screen in a determined angle, wherein the pressure squeegee is pressed on the screen in an angle exceeding the determined angle, and wherein the angle exceeding the determined angle is less than 90° and the angles are formed using at least one rotary unit,
   wherein the at least one rotary unit rotates the first and second squeegees and changes angles of the first and second squeegees against the screen.

* * * * *